(12) United States Patent
Ohnishi et al.

(10) Patent No.: US 9,494,864 B2
(45) Date of Patent: Nov. 15, 2016

(54) RESIST OVERLAYER FILM FORMING COMPOSITION FOR LITHOGRAPHY AND METHOD FOR MANUFACTURING SEMICONDUCTOR DEVICE USING THE SAME

(71) Applicant: NISSAN CHEMICAL INDUSTRIES, LTD., Tokyo (JP)

(72) Inventors: Ryuji Ohnishi, Toyama (JP); Rikimaru Sakamoto, Toyama (JP); BangChing Ho, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/426,666

(22) PCT Filed: Aug. 30, 2013

(86) PCT No.: PCT/JP2013/073332
§ 371 (c)(1),
(2) Date: Mar. 6, 2015

(87) PCT Pub. No.: WO2014/038483
PCT Pub. Date: Mar. 13, 2014

(65) Prior Publication Data
US 2015/0248057 A1    Sep. 3, 2015

(30) Foreign Application Priority Data

Sep. 7, 2012    (JP) ................................. 2012-197241

(51) Int. Cl.
| | | |
|---|---|---|
| *G03F 7/11* | (2006.01) | |
| *C09D 161/12* | (2006.01) | |
| *H01L 21/027* | (2006.01) | |
| *G03F 7/16* | (2006.01) | |
| *G03F 7/09* | (2006.01) | |
| *C08G 8/04* | (2006.01) | |
| *C08G 14/06* | (2006.01) | |
| *C09D 161/34* | (2006.01) | |

(52) U.S. Cl.
CPC . *G03F 7/11* (2013.01); *C08G 8/04* (2013.01); *C08G 14/06* (2013.01); *C09D 161/12* (2013.01); *C09D 161/34* (2013.01); *G03F 7/091* (2013.01); *G03F 7/168* (2013.01); *H01L 21/0271* (2013.01); *H01L 21/0274* (2013.01)

(58) Field of Classification Search
CPC .......................... C09D 161/06; C09D 161/12
See application file for complete search history.

(56) References Cited

U.S. PATENT DOCUMENTS

| | | | | | |
|---|---|---|---|---|---|
| 4,681,923 | A | * | 7/1987 | Demmer | .................. C08G 8/28 204/478 |
| 5,115,074 | A | * | 5/1992 | Umetani | ................ C07C 65/105 525/450 |
| 5,266,440 | A | * | 11/1993 | Zampini | ............... G03F 7/0226 430/165 |
| 7,537,880 | B2 | * | 5/2009 | Harada | .................... C08F 24/00 430/270.1 |
| 2012/0220112 | A1 | * | 8/2012 | Hatakeyama | ........... G03F 7/085 438/514 |
| 2013/0143162 | A1 | * | 6/2013 | Hatakeyama | ........... C08L 65/00 430/296 |

FOREIGN PATENT DOCUMENTS

| | | |
|---|---|---|
| JP | 2004-348133 A | 12/2004 |
| JP | 2008-065304 A | 3/2008 |
| JP | 2008-198788 A | 8/2008 |
| JP | 2009-164441 A | 7/2009 |
| JP | 2012-098431 A | 5/2012 |
| JP | 2013-120194 A | 6/2013 |
| WO | 2012/053302 A1 | 4/2012 |

OTHER PUBLICATIONS

Oct. 22, 2013 Written Opinion issued in International Application No. PCT/JP2013/073332.
Shimizu et al. "Development of Chemically Amplified EUV Resist for 22 nm Half Pitch and Beyond," International Symposium on EUVL, Oct. 18, 2011.
Kim et al. "CD Uniformity Improvement for EUV Resists Process: EUV Resolution Enhancement Layer", Extreme Ultraviolet (EUV) Lithography II, vol. 7969, 796917-1, 2011.

* cited by examiner

*Primary Examiner* — Cynthia Hamilton
(74) *Attorney, Agent, or Firm* — Oliff PLC

(57) ABSTRACT

A resist overlayer film forming composition that is used for a lithography process for manufacturing semiconductor devices, and selectively transmits EUV only, in particular, by blocking exposure light undesirable for EUV exposure, such as UV and DUV, without intermixing with a resist, and that can be developed with a developing solution after exposure. A resist overlayer film forming composition including: a hydroxyl group-containing novolac-based polymer containing a structure of (Formula 1-1):

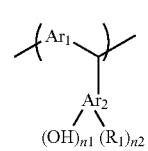

(Formula 1-1)

(in (Formula 1-1), $Ar_1$ is a divalent organic group that contains 1 to 3 benzene ring(s) and optionally contains a hydroxy group; $Ar_2$ is a benzene ring group, a naphthalene ring group, or an anthracene ring group; each of the hydroxy group and $R_1$ is a substituent for a hydrogen atom on a ring of $Ar_2$); and a solvent.

12 Claims, No Drawings

RESIST OVERLAYER FILM FORMING COMPOSITION FOR LITHOGRAPHY AND METHOD FOR MANUFACTURING SEMICONDUCTOR DEVICE USING THE SAME

TECHNICAL FIELD

The present invention relates to a resist overlayer film forming composition for lithography, which is used in a semiconductor device manufacturing process using photolithography, reduces adverse effects caused by exposure light, and is effective at obtaining a favorable resist pattern, as well as to a method for forming a resist pattern using the resist overlayer film forming composition for lithography, and to a method for manufacturing a semiconductor device using the method for forming the resist pattern.

BACKGROUND ART

Microfabrication using photolithography techniques has conventionally been performed in manufacturing of semiconductor devices. The microfabrication is a process of forming a thin film of a photoresist composition on a substrate to be processed, such as a silicon wafer, radiating active light such as ultraviolet rays thereon through a mask pattern having semiconductor device patterns, developing the pattern, and etching the substrate to be processed, such as a silicon wafer, using the resulting photoresist pattern as a protection film (mask). With the increasing density of semiconductor devices in recent years, the active light used have been changed to those at shorter wavelengths, for example, from a KrF excimer laser (a wavelength of 248 nm) to an ArF excimer laser (a wavelength of 193 nm). Accordingly, the effects of diffuse reflection of active light from the substrate or standing waves become a serious issue, and a method has been widely adopted in which an anti-reflective coating (Bottom Anti-Reflective Coating, BARC) is provided as a resist underlayer film between the photoresist and the substrate to be processed for serving the function of preventing reflection.

Known examples of the anti-reflective coatings include: inorganic anti-reflective coatings including, for example, titanium, titanium dioxide, titanium nitride, chromium oxide, carbon, and α-silicon; and organic anti-reflective coatings made from a light absorbing substance and a polymer compound. The former requires systems for forming films, such as a vacuum deposition apparatus, a CVD apparatus, and a sputtering apparatus, whereas the latter requires no special system. In this respect, organic anti-reflective coatings are advantageous and have been elaborately examined.

An ArF immersion lithography technique in which exposure is performed through water has been in actual use in recent years as a next-generation photolithography technique that replaces the photolithography technique using ArF excimer laser (a wavelength of 193 nm). The photolithography techniques using light, however, have been approaching their limits. An EUV lithography technique using EUV (a wavelength of 13.5 nm) has been attracting attention as a new lithography technique after the ArF immersion lithography technique. In the semiconductor device manufacturing process using EUV lithography, a substrate coated with an EUV resist is exposed by EUV radiation and developed to form a resist pattern.

In order to protect the EUV resist from contaminants or to block undesired radiation such as UV or DUV (out of band (OOB)), a method has been described, in which the overlayer of the EUV resist includes a polymer including a group containing at least one of beryllium, boron, carbon, silicon, zirconium, niobium, and molybdenum (Patent Document 1 and Patent Document 2).

In order to block OOB, for example, onto an overlayer of the EUV resist, a top coating comprising a polyhydroxystyrene (PHS) compound, an acryl compound, or the like is applied to reduce OOB (Non-Patent Document 1), and onto an overlayer of the EUV resist, a film that is called an EUV resolution enhancement layer is applied so that OOB is absorbed to improve the resolution of the EUV resist (Non-Patent Document 2); however, there are no descriptions for what types of compositions are optimal. In addition, a novolac material comprising a naphthalene ring is described as a resist overlayer film forming composition for EUV lithography (Patent Document 3).

PRIOR ART DOCUMENTS

Patent Documents

Patent Document 1: Japanese Patent Application Publication No. 2004-348133 (JP 2004-348133 A)
Patent Document 2: Japanese Patent Application Publication No. 2008-198788 (JP 2008-198788 A)
Patent Document 3: WO2012/053302 Pamphlet

Non-Patent Documents

Non-Patent Document 1: Shimizu, M., Maruyama, K., Kimura, T., Nakagawa, H., Sharma, S., "Development of Chemically Amplified EUV resist for 22 nm half pitch and beyond" Extreme Ultraviolet Lithography Symposium, Miami, (October 2011)
Non-Patent Document 2: Proc. of SPIE Vol. 7969, 796916-1

SUMMARY OF THE INVENTION

Problem to be Solved by the Invention

The present invention was completed to provide an optimal resist overlayer film forming composition to solve the problems described above. The composition is provided as a resist overlayer film forming composition used for a lithography process for manufacturing semiconductor devices, and the composition selectively transmit EUV as a resist overlayer film, in particular, as an overlayer film for an EUV resist, by blocking exposure light undesirable for EUV exposure, such as UV and DUV, without intermixing with a resist. In addition, the resist overlayer film can be developed with a developing solution after exposure.

Means for Solving the Problem

The present invention provides: as a first aspect, a resist overlayer film forming composition comprising: a polymer containing a unit structure of (Formula 1-1):

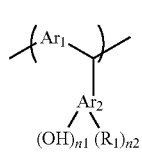

(Formula 1-1)

(in (Formula 1-1), $Ar_1$ is a divalent organic group that contains 1 to 3 benzene ring(s) and optionally contains a hydroxy group; $Ar_2$ is a benzene ring group, a naphthalene ring group, or an anthracene ring group; each of the hydroxy group and $R_1$ is a substituent for a hydrogen atom on a ring of $Ar_2$; $R_1$ is a halogen atom, a carboxy group, a nitro group, a cyano group, a $C_{1-6}$ alkoxy group, a $C_{1-6}$ linear or branched saturated alkyl group, or a $C_{1-6}$ linear or branched saturated halogenated alkyl group; each of n1 and n2 is independently an integer of 0 to 9, and a maximum value of (n1+n2) is 9); and a solvent;

as a second aspect, the resist overlayer film forming composition according to the first aspect, in which $Ar_1$ is an organic group of (Formula 1-2-a), an organic group of (Formula 1-2-c), an organic group of a mixture of (Formula 1-2-a) and (Formula 1-2-b), or an organic group of a mixture of (Formula 1-2-b) and (Formula 1-2-c):

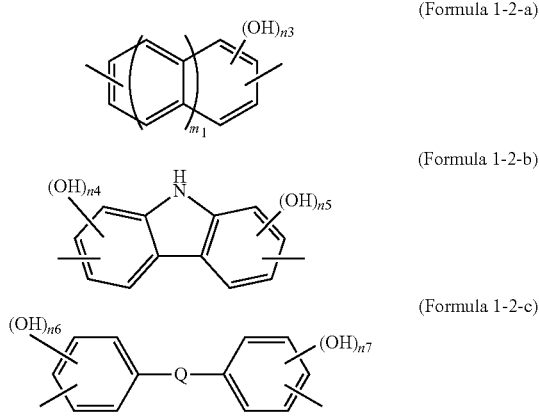

(in Formulae (1-2-a) to (1-2-c), m1 is an integer of 0 to 2; n3 is an integer of 2 to 4; each of n4 and n5 is an integer of 0 to 2; each of n6 and n7 is an integer of 1 or 2; and Q is a single bond or a $C_{1-6}$ alkylene group);

as a third aspect, the resist overlayer film forming composition according to the first aspect or the second aspect, in which the polymer containing the unit structure of (Formula 1-1) is synthesized from a compound that contains 1 to 3 benzene ring(s) and optionally contains a hydroxy group, as described in the first aspect or the second aspect, and a compound of (Formula 1-3):

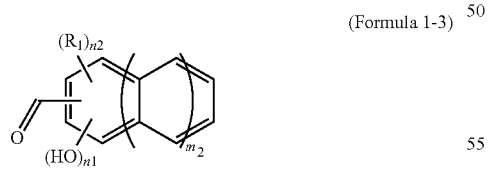

(in (Formula 1-3), m2 is an integer of 0 to 2; and n1, n2, (n1+n2), and $R_1$ are defined as the same as those described in the first aspect);

as a fourth aspect, the resist overlayer film forming composition according to any one of the first to third aspects, in which a weight-average molecular weight of the polymer measured by a GPC method is 800 to 10,000 in terms of polystyrene;

as a fifth aspect, the resist overlayer film forming composition according to any one of the first to fourth aspects, in which the solvent as described in the first aspect is a $C_{1-20}$ linear saturated alkyl alcohol, a $C_{3-20}$ branched or cyclic saturated alkyl alcohol, or a $C_{6-20}$ aromatic alcohol;

as a sixth aspect, the resist overlayer film forming composition according to the fifth aspect, in which the solvent as described in the first aspect comprises any of 1-heptanol, 2-methyl-1-butanol, 2-methyl-2-butanol, 4-methyl-2-pentanol, or cyclopentanol;

as a seventh aspect, the resist overlayer film forming composition according to any one of the first to sixth aspects, further comprising a basic compound;

as an eighth aspect, the resist overlayer film forming composition according to any one of the first to fourth aspects, in which the solvent as described in the first aspect is water, and the resist overlayer film forming composition further comprises a basic compound;

as a ninth aspect, the resist overlayer film forming composition according to the eighth aspect, in which n2 $R_1$(s) as described in the first aspect or the third aspect contain(s) at least one carboxy group in total;

as a tenth aspect, the resist overlayer film forming composition according to any one of the first to ninth aspects, further comprising an acid compound;

as an eleventh aspect, the resist overlayer film forming composition according to the tenth aspect, in which the acid compound is a sulfonic acid compound or a sulfonic acid ester compound;

as a twelfth aspect, the resist overlayer film forming composition according to the tenth aspect, in which the acid compound is an onium salt-based acid generator or a halogen-containing compound-based acid generator;

as a thirteenth aspect, the resist overlayer film forming composition according to any one of the first to twelfth aspects, in which a resist used with the composition is a resist for EUV (a wavelength of 13.5 nm);

as a fourteenth aspect, a method for manufacturing a semiconductor device, the method comprising: forming a resist film on a substrate; applying the resist overlayer film forming composition as described in any one of the first to thirteenth aspects on the resist film and baking the composition to form a resist overlayer film; exposing the semiconductor substrate coated with the resist overlayer film and the resist film; and performing development after the exposure to remove the resist overlayer film and the resist film; and as a fifteenth aspect, the method for manufacturing a semiconductor device according to the fourteenth aspect, in which the exposure is performed with EUV (a wavelength of 13.5 nm).

Effects of the Invention

The present invention relates to a resist overlayer film forming composition, which selectively transmits EUV as a resist overlayer film forming composition, in particular, as an overlayer film forming composition for an EUV resist, by blocking exposure light undesirable for EUV exposure, such as UV and DUV, without intermixing with an EUV resist, and which can be developed with a developing solution after exposure.

In particular, when an EUV resist is exposed, UV light and DUV light are also emitted with EUV light. The EUV light contains about 5% of other light having a wavelength of 300 nm or below in addition to the EUV light. For example, other light having a wavelength range of 190 nm to 300 nm, particularly around 220 nm to 260 nm, is strongest, resulting in lower sensitivity and deteriorated pattern shape of an EUV resist. In cases where a line width is 22 nm or below, the UV light and DUV light (Out of Band/out-of-band radiation) start to adversely affect the resolution of an EUV resist.

In order to remove light having a wavelength around 220 nm to 260 nm, a filter can be provided on a lithography system. However, this makes steps complicated. In the present invention, DUV light contained in EUV exposure light (Out of Band/out-of-band radiation), particularly undesirable DUV light having a wavelength of 220 nm to 260 nm, is absorbed with an aromatic ring of a novolac-based polymer contained in a composition of the present invention, such as a benzene ring, a naphthalene ring, and an anthracene ring, to improve the resolution of an EUV resist.

When covering the top layer of an EUV resist, an alcoholic solvent or water is preferably used for the resist overlayer film forming composition instead of a solvent used for an EUV resist, in order to prevent intermixing (mixing of layers) with the EUV resist. In this case, a novolac-based polymer having a hydroxy group is used for the resist overlayer film forming composition of the present invention, in order to enhance solubility to the alcoholic solvent or water.

Because the novolac-based polymer used for the resist overlayer film forming composition of the present invention has a hydroxy group, it can be dissolved in a developing solution (for example, an alkaline developing solution) together with the EUV resist at the time of development after exposure. Thus, the novolac-based polymer can be dissolved in the developing solution so as to be removed.

MODES FOR CARRYING OUT THE INVENTION

The present invention provides a resist overlayer film forming composition comprising a novolac-based polymer containing a hydroxy group and a solvent. As the solvent, an alcoholic solvent or water is preferable in order to prevent intermixing (mixing of layers) with an EUV resist. The present invention is preferable as a resist overlayer film, and is particularly preferable as a resist overlayer film forming composition used in an EUV lithography step in which an exposure wavelength is EUV.

Hereinafter, the resist overlayer film forming composition of the present invention will be explained in detail.

A novolac-based polymer used in the present invention is a polymer comprising an aromatic compound having a hydroxy group. The polymer having repeating unit structures is selected from the following general formulae: one type selected from (Formula 2-1) to (Formula 2-3), or two or more types selected from (Formula 2-1) to (Formula 2-3) in a combination. In cases where the combination includes two types or more, the polymer is a copolymerized polymer.

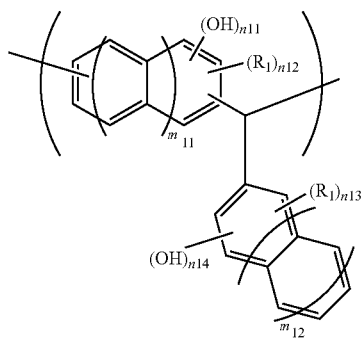

(Formula 2-1)

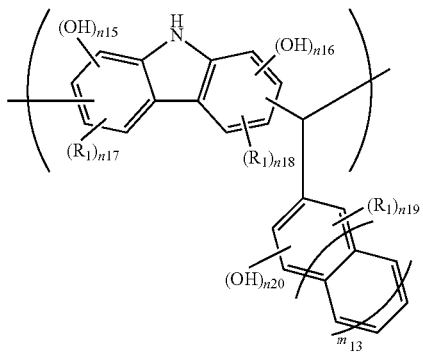

(Formula 2-2)

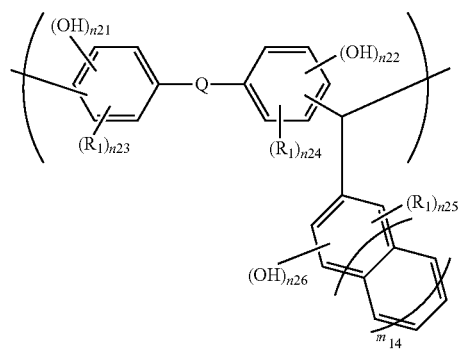

(Formula 2-3)

(In Formulae (2-1) to (2-3), each of $m_{11}$ to $m_{14}$ is independently an integer of 0 to 2, preferably an integer of 0 or 1; each of n11 and n12 is independently an integer of 0 to 8, preferably an integer of 0 to 4; each of n13, n14, n19, n20, n25, and n26 is independently an integer of 0 to 9, preferably an integer of 0 to 4; and an each maximum value of (n13+n14), (n19+n20), and (n25+n26) is 9, preferably 4. Each of n15, n16, n17, and n18 is independently an integer of 0 to 3, and an each maximum value of (n15+n17) and (n16+n18) is 3. Each of n21 to n24 is independently an integer of 0 to 4, preferably an integer of 0 to 2; and an each maximum value of (n21+n23) and (n22+n24) is 4, preferably 2. In a compound comprising $Ar_1$ that is composed of one type or a combination of two types or more, at least one type of compound contains one or more hydroxy group(s) and 1 to 3 benzene ring(s).)

$R_1$ is a halogen atom, a carboxy group, a nitro group, a cyano group, a $C_{1-6}$ alkoxy group, a $C_{1-6}$ linear or branched saturated alkyl group, or a $C_{1-6}$ linear or branched saturated halogenated alkyl group.

Q in Formula (2-3) is a single bond or a $C_{1-6}$ alkylene group.

Examples of the halogen atom include a fluorine atom, a chlorine atom, a bromine atom, and an iodine atom.

Examples of the $C_{1-6}$ alkoxy group include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, a 1-ethyl-1-methyl-n-propoxy group, and a 1-ethyl-2-methyl-n-propoxy group.

Examples of the $C_{1-6}$ linear or branched saturated alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and 2-ethyl-3-methyl-cyclopropyl group.

Examples of the $C_{1-6}$ linear or branched saturated halogenated alkyl group include a group in which all or part of hydrogen contained in the $C_{1-6}$ linear or branched saturated alkyl group described above is substituted with a halogen atom(s) (fluorine atom, chlorine atom, bromine atom, or iodine atom), and specific examples thereof include a trifluoromethyl group, a trichloromethyl group, a tribromomethyl group, and a triiodomethyl group.

The $C_{1-6}$ alkylene group is a divalent organic group corresponding to the alkyl group described above, and examples thereof include a methylene group, an ethylene group, an n-propylene group, an isopropylene group, a cyclopropylene group, an n-butylene group, an isobutylene group, an s-butylene group, a t-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, and a 2-ethyl-3-methyl-cyclopropylene group.

Examples of an aromatic compound having a hydroxy group as a monomer for synthesizing the polymer of (Formula 2-1) include each of the compounds of (Formula 3-1) to (Formula 3-26) below.

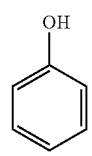

(Formula 3-1)

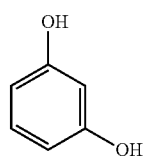

(Formula 3-2)

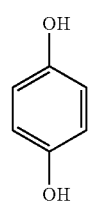

(Formula 3-3)

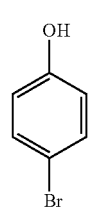

(Formula 3-4)

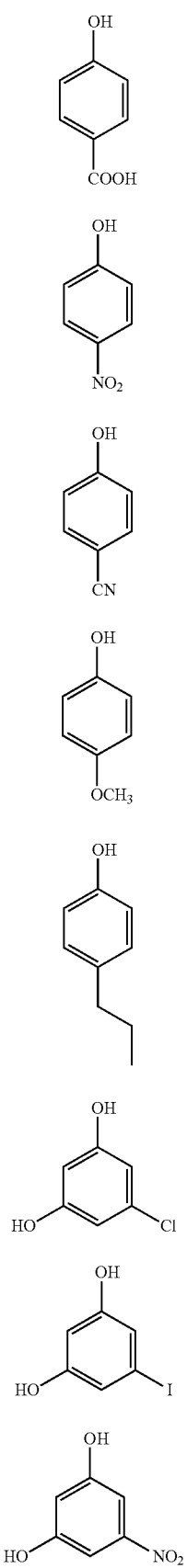
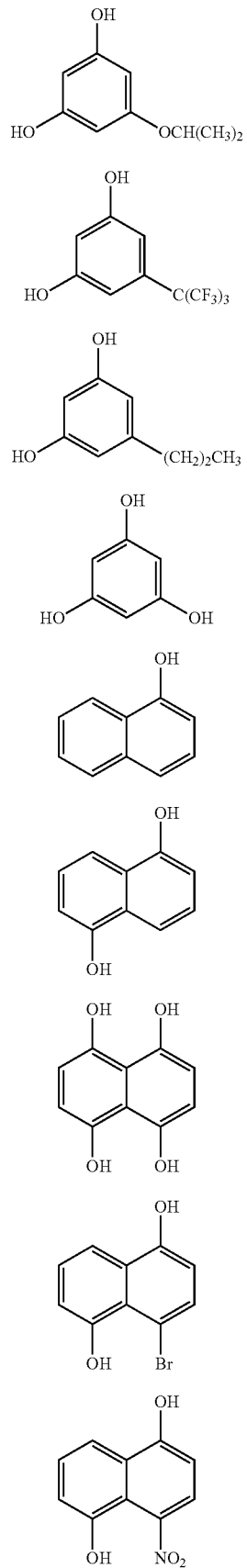

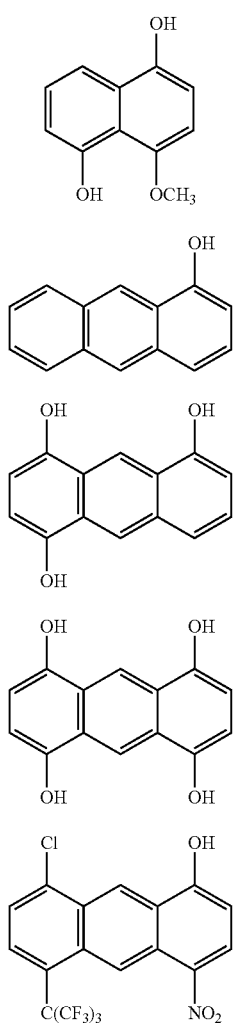

(Formula 3-22)

(Formula 3-23)

(Formula 3-24)

(Formula 3-25)

(Formula 3-26)

Examples of a carbazole-based compound as a monomer for synthesizing the polymer of (Formula 2-2) include each of the compounds of (Formula 4-1) to (Formula 4-10) below.

(Formula 4-1)

(Formula 4-2)

(Formula 4-3)

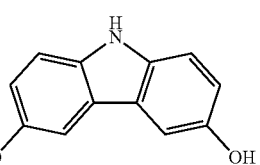

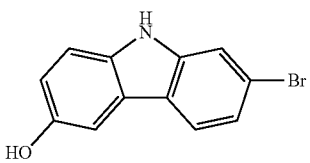

(Formula 4-4)

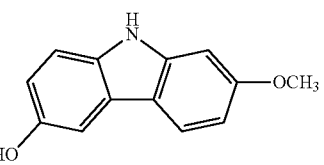

(Formula 4-5)

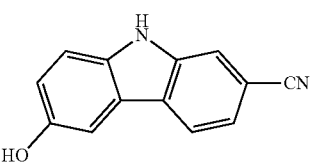

(Formula 4-6)

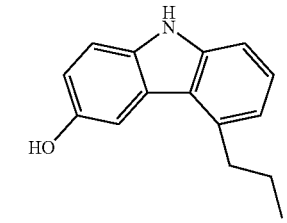

(Formula 4-7)

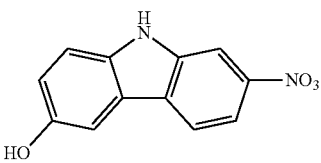

(Formula 4-8)

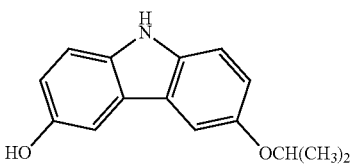

(Formula 4-9)

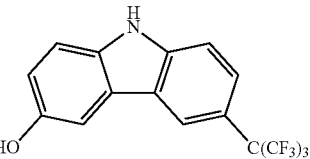

(Formula 4-10)

Examples of an aromatic compound as a monomer for synthesizing the polymer of (Formula 2-3) include each of the compounds of (Formula 5-1) to (Formula 5-8) below.

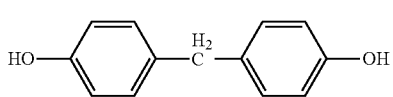

(Formula 5-1)

(Formula 5-2)
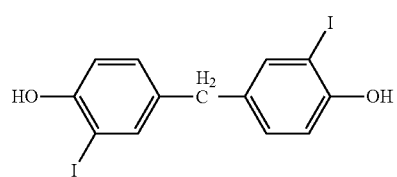
(Formula 5-3)
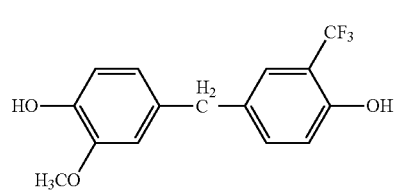
(Formula 5-4)
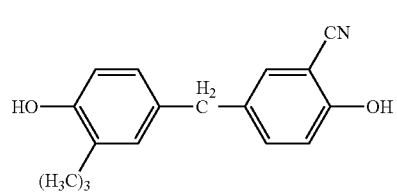
(Formula 5-5)
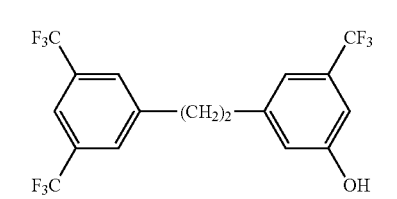
(Formula 5-6)
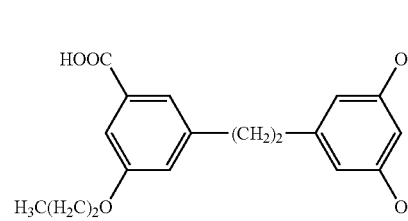
(Formula 5-7)
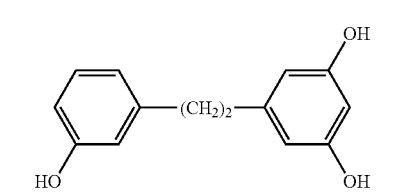
(Formula 5-8)
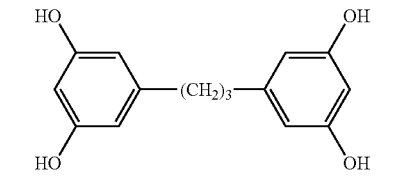
Examples of an aromatic aldehyde compound as a monomer for synthesizing each of the polymers of (Formula 2-1) to (Formula 2-3) include each of the compounds of (Formula 6-1) to (Formula 6-29) below.
(Formula 6-1)
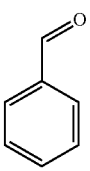
(Formula 6-2)
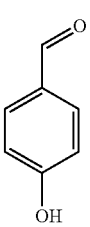
(Formula 6-3)
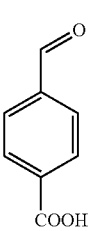
(Formula 6-4)
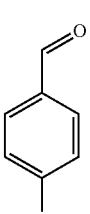
(Formula 6-5)
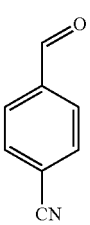
(formula 6-6)
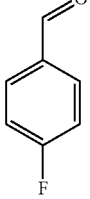
(Formula 6-7)
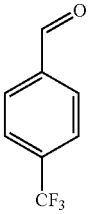

-continued
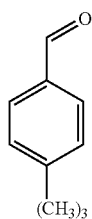
(Formula 6-8)
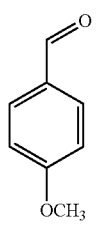
(Formula 6-9)
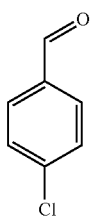
(Formula 6-10)
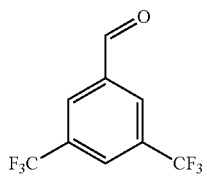
(Formula 6-11)
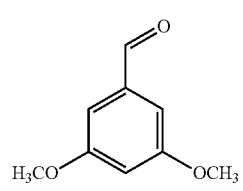
(Formula 6-12)
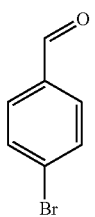
(Formula 6-13)
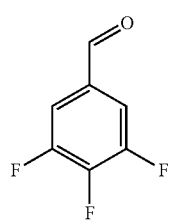
(Formula 6-14)
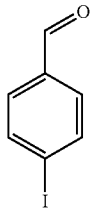
(Formula 6-15)
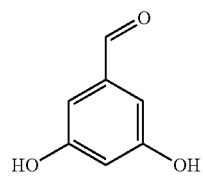
(Formula 6-16)
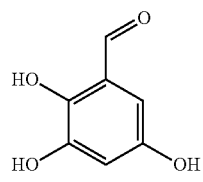
(Formula 6-17)
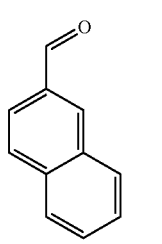
(Formula 6-18)
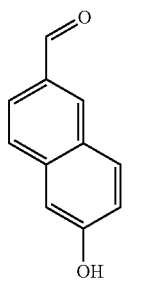
(Formula 6-19)
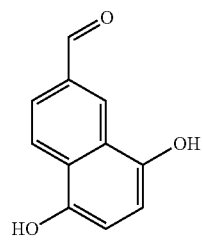
(Formula 6-20)
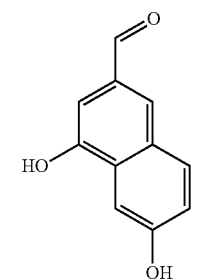
(Formula 6-21)

(Formula 6-22)
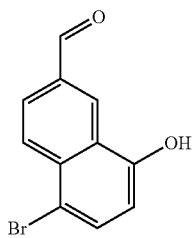

(Formula 6-23)
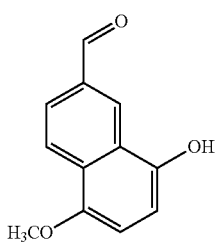

(Formula 6-24)
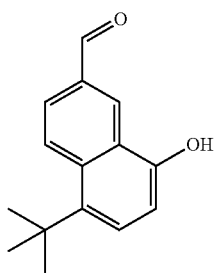

(Formula 6-25)
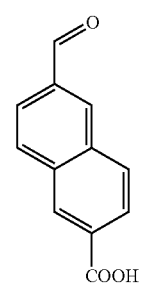

(Formula 6-26)
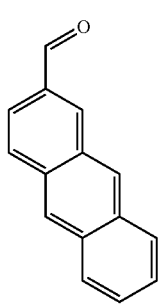

(Formula 6-27)
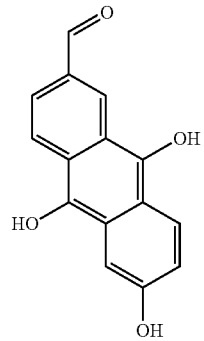

(Formula 6-28)
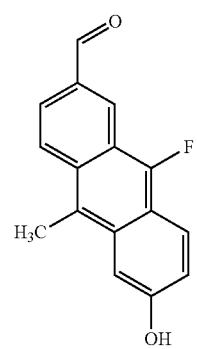

(Formula 6-29)
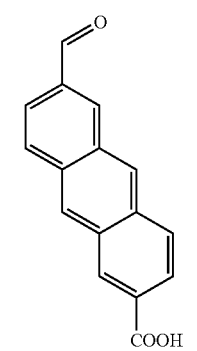

In a common method for synthesizing a novolac-based polymer used in the present invention, an aromatic compound having a hydroxy group (hereinafter, called a "monomer group A," and the monomer group A is a compound composing the $Ar_1$ described above), or a combination of the aromatic compound having a hydroxy group (monomer group A) and an aromatic compound not having any hydroxy groups (hereinafter, called a "monomer group B," and the monomer group B is a compound composing $Ar_1$ described above), and an aromatic aldehyde, such as the one represented by each of (Formula 6-1) to (Formula 6-29) (hereinafter, called a "monomer group C," and the monomer group C is a compound composing $Ar_2$ described above), are condensation polymerized under the presence of an acid catalyst.

Although each of the monomer group A, monomer group B, and monomer group C includes one type or two types or more, it is preferably three types or less, and more preferably two types or less. When a polymer is synthesized, a charged mole ratio of the monomer group A to monomer group B, that is, the monomer group A/monomer group B can be not less than 20/80 and not more than 99/1, and preferably not less than 40/60 and not more than 90/10.

In cases where the monomer group C includes two types or more monomers, a charged mole ratio of each of the monomers to total of the monomer group C can be at least 1/20 or more, and preferably 1/10 or more.

When a polymer of the present invention is synthesized, a charged mole ratio of (monomer group A+monomer group B)/(monomer group C) can be 90/100 to 100/90.

A novolac-based polymer having a hydroxy group of the present invention is manufactured preferably with the monomer group A, or with a combination of the monomer group A and the monomer group B, and the reaction with the monomer group C is preferably conducted under a nitrogen atmosphere. The reaction temperature can be optionally selected from 50° C. to 200° C., and preferably from 80° C. to 180° C. A high molecule weight novolac-based polymer having a hydroxy group can be obtained with a reaction time of 1 hour to 48 hours. In order to obtain a low molecular weight novolac-based polymer having a hydroxy group which is highly stable for storing, the reaction time is preferably 1 hour to 24 hours at 80° C. to 150° C.

Although a weight-average molecular weight of a novolac-based polymer having a hydroxy group used in the present invention, which is measured by gel permeation chromatography (GPC), varies depending on a coating solvent, a solution viscosity, and the like, it is for example, 800 to 10,000, and preferably 900 to 8,000 in terms of polystyrene. In cases where the weight-average molecular weight is not more than 800, a resist overlayer film utilizing the novolac-based polymer having a hydroxy group is dispersed in a photoresist, which may worsen the property of lithography. In cases where the weight-average molecular weight is not less than 10,000, a formed resist overlayer film is not sufficiently soluble to a developing solution for photoresists, and residues may exist after development.

A solid content of the novolac-based polymer having a hydroxy group in a resist overlayer film forming composition is 20% by mass or more, for example, 20% by mass to 100% by mass, or 30% by mass to 100% by mass, or 50% by mass to 90% by mass, or 60% by mass to 80% by mass.

The resist overlayer film forming composition of the present invention has a solid content of 0.1% by mass to 50% by mass and preferably 0.3% by mass to 30% by mass. The solid content refers to the content of the resist overlayer film forming composition excluding a solvent component.

A reaction of monomers for synthesizing the novolac-based polymer having a hydroxy group can be conducted in a solvent. Examples of the solvent used for the synthesis include dioxane, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate.

As other solvents, examples of an alcoholic solvent include 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 2-methyl-2-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol, and cyclohexanol.

These can be used singly or as a mixture. A solvent not dissolving the novolac-based polymer having a hydroxy group can also be used by mixing it into the above-described solvent, with the amount that does not allow the novolac-based polymer having a hydroxy group generated by a polymerization reaction to be precipitated.

A solution containing the novolac-based polymer having a hydroxy group thus obtained can be used as it is for preparing a resist overlayer film forming composition. Alternatively, the novolac-based polymer having a hydroxy group can be precipitated with a poor solvent, such as methanol, ethanol, ethyl acetate, hexane, toluene, acetonitrile, and water, or a mixed solvent thereof to be isolated and collected. The isolated novolac-based polymer having a hydroxy group can be used as it is by redissolving in a solvent used for a composition of the present invention, or can be used after drying. The condition for drying the isolated novolac-based polymer is preferably at 40° C. to 100° C. for 6 hours to 48 hours in an oven or the like. After collecting the novolac-based polymer having a hydroxy group, it can be used as a resist overlayer film composition after redissolving in any solvent, preferably in the alcoholic solvent described below or water.

In a resist overlayer film forming composition of the present invention, the following alcoholic solvent or water is preferably used for the novolac-based polymer having a hydroxy group described above instead of a solvent usually used for resists, in order to prevent intermixing (mixing of layers) when the composition is applied on a resist to form a film.

Examples of saturated alkyl alcohols include 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 2-methyl-2-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol, and cyclohexanol.

Examples of aromatic alcohols include 1-phenylpropanol, 2-phenylpropanol, 3-phenylpropanol, 2-phenoxyethanol, phenethyl alcohol, and styralyl alcohol.

These alcoholic solvents can be used singly or as a mixture. Water can also be used singly or as a mixture with one or more types of the alcoholic solvents described above.

For example, for the convenience of the synthesis of the novolac-based polymer having a hydroxy group according to the present invention, additional solvents below may be mixed with the alcoholic solvents described above. Examples of the additional solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used singly or in combination of two or more. The ratio of these additional solvents contained to the alcoholic solvent may be 0.01% by mass to 30.00% by mass.

The resist overlayer film forming composition contains the novolac-based polymer having a hydroxy group and an alcoholic solvent or water, and can further contain an acid compound, a basic compound, a cross-linking agent, a cross-linking catalyst, a surfactant, a rheology modifier, and the like.

The resist overlayer film forming composition of the present invention may further contain an acid compound in order to match the acidity to that of the underlying resist in the lithography process. As the acid compound, for example, a sulfonic acid compound or a sulfonic acid ester compound can be used. For example, acidic compounds such as bis(4-hydroxyphenyl)sulfone, p-toluenesulfonic acid, trifluoromethanesulfonic acid, pyridinium p-toluenesulfonate, salicylic acid, sulfosalicylic acid, citric acid, benzoic acid, and hydroxybenzoic acid, and/or thermal acid generators such as 2,4,4,6-tetrabromocyclohexadienone, benzoin tosylate, and 2-nitrobenzyl tosylate can be blended. The blended amount is 0.02% by mass to 10% by mass and preferably 0.04% by mass to 5% by mass relative to 100% by mass of the total solid content.

The resist overlayer film forming composition of the present invention may contain an acid generator that generates an acid by exposure light (for example, ArF excimer laser radiation, EUV radiation, and electron beam radiation) in order to match the acidity to that of the underlying resist in the lithography process. Preferred examples of the acid generator include: onium salt-based acid generators such as bis(4-tert-butylphenyl)iodonium trifluoromethanesulfonate and triphenylsulfonium trifluoromethanesulfonate; halogen-containing compound-based acid generators such as phenyl-bis(trichloromethyl)-s-triazine; and sulfonic acid-based acid generators such as benzoin tosylate and N-hydroxysuccinimide trifluoromethanesulfonate. The amount of the acid generator added is 0.02% by mass to 10% by mass and preferably 0.04% by mass to 5% by mass relative to 100% by mass of the total solid content.

The resist overlayer film forming composition of the present invention may contain a basic compound. By adding a basic compound, the sensitivity of a resist at the time of exposure can be controlled. That is, a basic compound such as an amine reacts with acid generated by a photo acid generator at the time of exposure to lower the sensitivity of a resist underlayer film, so that the shape of the upper portion of a resist after exposure and development can be controlled (the shape of a resist after exposure and development is preferably a rectangle). Further, by adding the basic compound to a novolac-based polymer, a salt is formed between the novolac-based polymer and the basic compound, and thus the novolac-based polymer becomes water-soluble.

Amines can be exemplified as the basic compounds.

Examples of amine compounds include ammonia, tetramethylammonium hydroxide, tetraethylammonium hydroxide, tetrapropylammonium hydroxide, tetrabutylammonium hydroxide, 2-aminophenol, 3-aminophenol, 4-aminophenol, benzyltrimethylammonium hydroxide, benzyltriethylammonium hydroxide, benzyltripropylammonium hydroxide, benzyltributylammonium hydroxide, N-benzyldimethylamine, N-benzyldiethylamine, N-benzylmethylamine, N-benzylethylamine, N-benzylisopropylamine, N-tert-butylbenzylamine;

pyridine, 4-methylpyridine, 4-ethylpyridine, 4-isopropylpyridine, 3-fluoropyridine, 4-bromopyridine, 4-fluoropyridine, 4-iodopyridine, 4-aminopyridine, 4-(bromomethyl)pyridine, 4-cyanopyridine, 4-methoxypyridine, N-(4-pyridyl)dimethylamine, 3,4-dimethylpyridine, 4-(methylamino)pyridine, 2-bromo-5-iodopyridine, 2-chloro-4-iodopyridine, 4-(aminomethyl)pyridine, 2,4,6-trimethylpyridine, 2,6-diaminopyridine, 1,5-naphthyridine;

diethylamine, N-tert-butylethylamine, N,N-diethylmethylamine, N-ethylisopropylamine, n-ethylmethylamine, diisopropylamine, N,N-dimethylethylamine, triethylamine, N-diisopropylethylamine, N,N-diethylethylenediamine, ethylamine;

2-(dimethylamino)ethanol, N-methyldiethanolamine, 2-(methylamino)ethanol, triethanolamine, 2-diethylaminoethanol, N-ethyldiethanolamine, diethanolamine, N-tert-butyldiethanolamine, 1-dimethylamino-2-propanol, 2-(diisopropylamino)ethanol, 2-(dimethylamino)isobutanol, 2-(ethylamino)ethanol;

2,2,2-trifluoroethylamine, trifluoroacetamide, N-methyltrifluoroacetamide, bistrifluoroacetamide, N,N-bis(trifluoroacetyl)methylamine, N-methyl-N-trimethylsilyltrifluoroacetamide, pentadecafluorotriethylamine;

4-methylmorpholine, 4-ethylmorpholine, bis(2-morpholinoethyl)ether, 4-(2-aminoethyl)morpholine, N-cyanomethylmorpholine, 4-(2-hydroxyethyl)morpholine, 4-isobutylmorpholine, 4-acetylmorpholine, N-(2-cyanoethyl)morpholine, N-(3-aminopropyl)morpholine, 4-(3-chloropropyl)morpholine, N-(2-hydroxypropyl)morpholine, 4-(3-hydroxypropyl)morpholine, 3-morpholino-1,2-propanediol, 1-morpholino-1-cyclohexene;

ethylenediamine, 1,2-propanediamine, 1,3-propanediamine, 2-methyl-1,2-propanediamine, 2,2-dimethyl-1,3-propanediamine, 1,3-butanediamine, 1,4-butanediamine, 1,3-pentanediamine (DAMP), 1,5-pentanediamine, 1,5-diamino-2-methylpentane (MPMD), 2-butyl-2-ethyl-1,5-pentanediamine (c11-neodiamine), 1,6-hexanediamine, 2,5-dimethyl-1,6-hexanediamine, 2,2,4-trimethylhexamethylenediamine (TMD), 2,4,4-trimethylhexamethylenediamine (TMD), 1,7-heptanediamine, 1,8-octanediamine, 1,9-nonanediamine, 1,10-decanediamine, 1,11-undecanediamine, 1,12-dodecanediamine, 1,2-diaminocyclohexane, 1,3-diaminocyclohexane, 1,4-diaminocyclohexane, bis(4-aminocyclohexyl)methane (H12-MDA), bis(4-amino-3-methylcyclohexyl)methane, bis(4-amino-3-ethylcyclohexyl)methane, bis(4-amino-3,5-dimethylcyclohexyl)methane, bis(4-amino-3-ethyl-5-methylcyclohexyl)methane (M-MECA), 1-amino-3-aminomethyl-3,5,5-trimethylcyclohexane (isophoronediamine, or IPDA), 2-methyl-1,3-diaminocyclohexane, 4-methyl-1,3-diaminocyclohexane, 1,3-bis(aminomethyl)cyclohexane, 1,4-bis(aminomethyl)cyclohexane, 2,5(2,6)-bis(aminomethyl)bicyclo[2.2.1]heptane (NBDA), 3(4),8(9)-bis(aminomethyl)tricyclo[5.2.1.0²,⁶]decane, 1,4-diamino-2,2,6-trimethylcyclohexane (TMCDA), 1,8-menthanediamine, 3,9-bis(3-aminopropyl)-2,4,8,10-tetraoxaspiro[5.5]undecane, 1,3-xylylenediamine, 1,4-xylylenediamine;

bis(2-aminoethyl)ether, 3,6-dioxaoctane-1,8-diamine, 4,7-dioxadecane-1,10-diamine, 4,7-dioxadecane-2,9-diamine, 4,9-dioxadodecane-1,12-diamine, 5,8-dioxadodecane-3,10-diamine;

4-aminomethyl-1,8-octanediamine, 1,3,5-tris(aminomethyl)benzene, 1,3,5-tris(aminomethyl)-cyclohexane, tris(2-aminoethyl)amine, tris(2-aminopropyl)amine, tris(3-aminopropyl)amine;

diethylenetriamine (DETA), triethylenetetramine (TETA), tetraethylenepentamine (TEPA), pentaethylenehexamine (PEHA), dipropylenetriamine (DPTA), bishexamethylenetriamine (BHMT), 3-(2-aminoethyl)aminopropylamine (N3-amine), N,N'-bis(3-aminopropyl)ethylenediamine (N4-amine), N3-(3-aminopentyl)-1,3-pentanediamine, N5-(3-aminopropyl)-2-methyl-1,5-pentanediamine, and N5-(3-amino-1-ethylpropyl)-2-methyl-1,5-pentanediamine;

N,N'-bis(aminopropyl)piperazine, N,N-bis(3-aminopropyl)methylamine, N,N-bis(3-aminopropyl)ethylamine, N,N-bis(3-aminopropyl)propylamine, N,N-bis(3-aminopropyl)cyclohexylamine, N,N-bis(3-aminopropyl)-2-ethylhexylamine, N,N-bis(3-aminopropyl)dodecylamine, N,N-bis(3-aminopropyl)tallow alkylamine;

methylamine, ethylamine, 1-propylamine, 2-propylamine, 1-butylamine, 2-butylamine, tert-butylamine, 3-methyl-1-butylamine, 3-methyl-2-butylamine, cyclopentylamine, hexylamine, cyclohexylamine, octylamine, 2-ethyl-1-hexylamine, benzylamine, 1-phenylethylamine, 2-phenylethylamine, decylamine, dodecylamine, tetradecylamine, hexadecylamine, octadecylamine, eicosylamine, docosylamine, coco alkylamine, $C_{16}$ to $C_{22}$-alkylamine, soya alkylamine, oleylamine, tallow alkylamine;

2-methoxyethylamine, 2-ethoxyethylamine, 3-methoxypropylamine, 3-ethoxypropylamine, 3-(2-ethylhexyloxy)propylamine, 3-(2-methoxyethoxy)propylamine, 2(4)-methoxyphenyl ethylamine;

N-methyl-1,2-ethanediamine, N-ethyl-1,2-ethanediamine, N-butyl-1,2-ethanediamine, N-hexyl-1,2-ethanediamine, N-butyl-1,6-hexanediamine, N-cyclohexyl-1,2-ethanediamine, 4-aminomethylpiperidine, 3-(4-aminobutyl)piperidine, N-(2-aminoethyl)piperazine (N-AEP), N-(2-aminopropyl)piperazine;

N-methyl-1,3-propanediamine, N-ethyl-1,3-propanediamine, N-butyl-1,3-propanediamine, N-hexyl-1,3-propanediamine, N-(2-ethylhexyl)-1,3-propanediamine, N-dodecyl-1,3-propanediamine, N-cyclohexyl-1,3-propanediamine, 3-methylamino-1-pentylamine, 3-ethylamino-1-pentylamine, 3-butylamino-1-pentylamine, 3-hexylamino-1-pentylamine, 3-(2-ethylhexyl)amino-1-pentylamine, 3-dodecylamino-1-pentylamine, 3-cyclohexylamino-1-pentylamine, N-coco alkyl-1,3-propanediamine, N-oleyl-1,3-propanediamine, N-soya alkyl-1,3-propanediamine, N-tallow alkyl-1,3-propanediamine, coco alkyldipropylenetriamine, oleyldipropylenetriamine, tallow alkyldipropylenetriamine, oleyltripropylenetetramine, tallow alkyltripropylenetetramine, N,N-diethyl-1,2-ethanediamine, N,N-dimethyl-1,3-propanediamine, N,N-diethyl-1,3-propanediamine, N,N-diethyl-1,4-pentanediamine;

butylamine, pentylamine, hexylamine, cyclohexylamine, octylamine, decylamine, dodecylamine, tetradecylamine, hexadecylamine, octadecylamine, eicosylamine, docosylamine, 2-ethyl-1-hexylamine, benzylamine, 1-phenylethylamine, 2-phenylethylamine, N-hexyl-1,2-ethanediamine, N-(2-ethylhexyl)-1,2-ethanediamine, N-cyclohexyl-1,2-ethanediamine, N-butyl-1,3-propanediamine, N-hexyl-1,3-propanediamine, N-(2-ethylhexyl)-1,3-propanediamine, N-dodecyl-1,3-propanediamine, N-cyclohexyl-1,3-propanediamine, coco alkylamine, soya alkylamine, oleylamine, N-coco alkyl-1,3-propanediamine, N-oleyl-1,3-propanediamine, and N-soya alkyl-1,3-propanediamine.
Among them, ammonia, tetramethylammonium hydroxide, tetraethylammonium hydroxide, tetrapropylammonium hydroxide, tetrabutylammonium hydroxide, 2-(dimethylamino)ethanol, 2,2,2-trifluoroethylamine, pyridine, and 4-methylmorpholine are preferable.

Additional examples include amino benzene compounds of Formula (13-1):

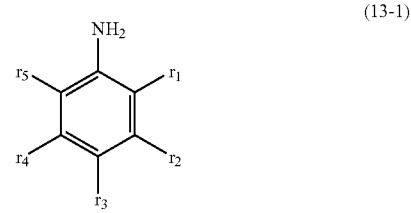

(13-1)

In Formula (13-1), each of $r_1$ to $r_5$ is a hydrogen atom, a $C_{1-10}$ alkyl group, or an amino group.

Examples of the alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Among them, $C_{1-5}$ linear alkyl groups and branched alkyl groups are preferable, and examples thereof include a methyl group, an ethyl group, and an isopropyl group.

Examples of the compound are represented by the following Formula (13-2) to Formula (13-47).

(13-2)

-continued
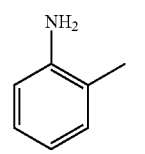 (13-3)
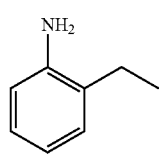 (13-4)
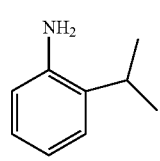 (13-5)
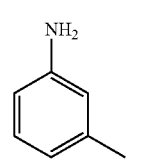 (13-6)
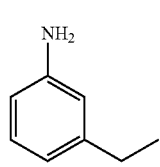 (13-7)
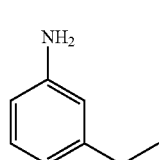 (13-8)
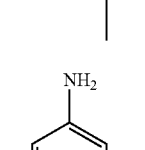 (13-9)
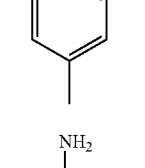 (13-10)
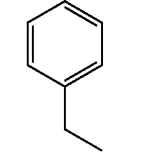 (13-11)
-continued
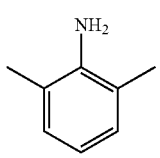 (13-12)
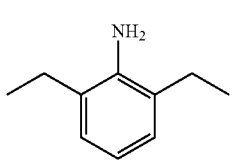 (13-13)
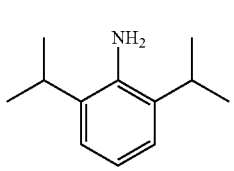 (13-14)
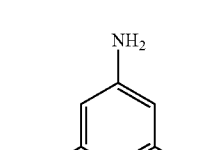 (13-15)
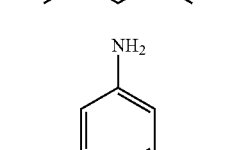 (13-16)
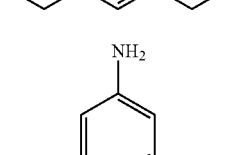 (13-17)
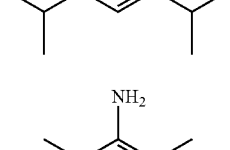 (13-18)
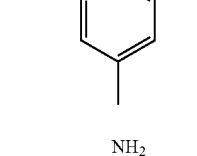 (13-19)
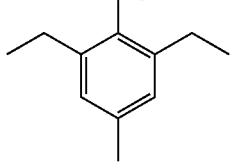 (13-20)
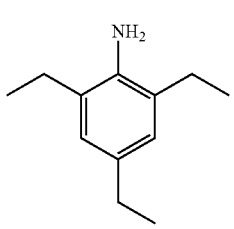

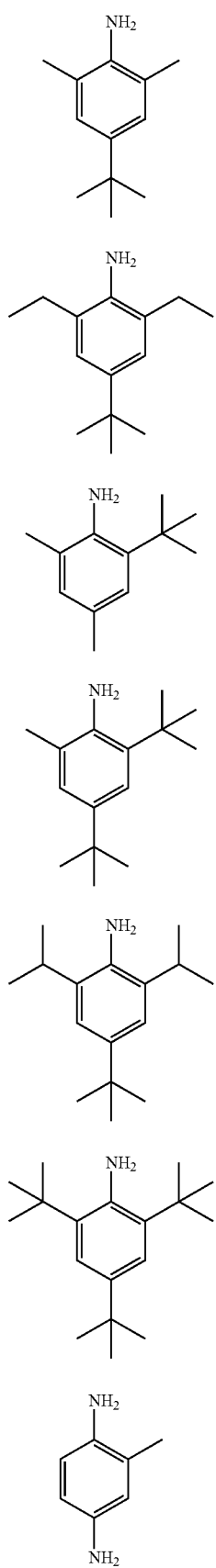
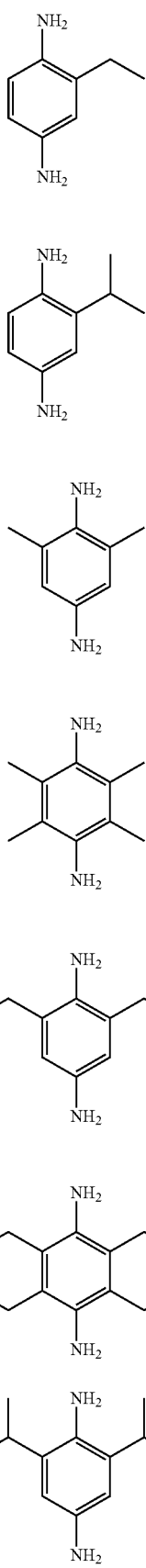

(13-35) 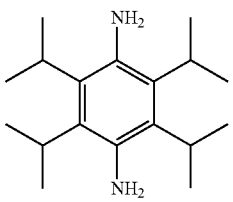

(13-36) 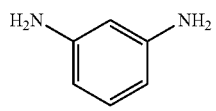

(13-37) 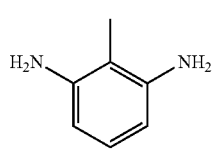

(13-38) 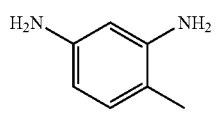

(13-39) 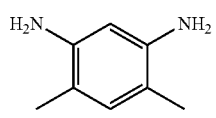

(13-40) 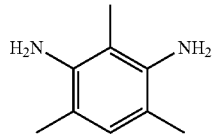

(13-41) 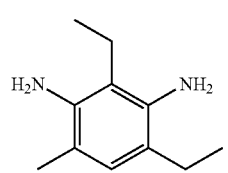

(13-42) 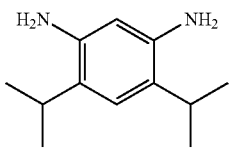

(13-43) 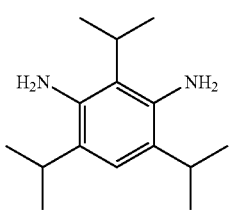

(13-44) 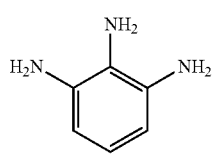

(13-46) 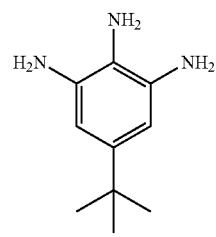

(13-47) 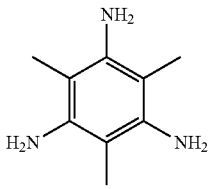

Additional examples include tertiary amines, such as triethanolamine, tributanolamine, trimethylamine, triethylamine, tri normal propylamine, triisopropylamine, tri normal butylamine, tri-tert-butylamine, tri normal octylamine, triisopropanolamine, phenyldiethanolamine, stearyldiethanolamine, and diazabicyclooctane; and aromatic amines, such as pyridine and 4-dimethylaminopyridine. The examples further include primary amines, such as benzylamine and normal butylamine; and secondary amines, such as diethylamine and di normal butylamine. These compounds can be used singly or in a combination of two or more.

The resist overlayer film forming composition of the present invention may further include a rheology control agent, a surfactant, or other additives as necessary in addition to the above components.

The rheology control agent is added mainly in order to improve flowability of the resist overlayer film forming composition. Specific examples include: phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. The ratio of these rheology control agents blended is generally less than 30% by mass with respect to 100% by mass of the total composition of the resist overlayer film forming composition.

The resist overlayer film forming composition of the present invention may further include a surfactant in order not to generate pinholes, striations, etc. and to further improve the coating properties against surface irregularities. Examples of the surfactant include: nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants such as EFTOP EF301, EF303, and EF352 (manufactured by Tochem Products), MEGAFAC F171 and F173 (manufactured by DIC Corporation), Fluorad FC430 and FC431 (manufactured by Sumitomo 3M Ltd.), Asahiguard AG710, Surflon S-382, SC101, SC102, SC103, SC104, SC105, and SC106 (manufactured by Asahi Glass Co., Ltd.), and FTERGENT series (manufactured by NEOS COMPANY LIMITED); and organosiloxane polymer KP341 (manufactured by Shin-Etsu Chemical Co., Ltd.). The amount of these surfactants blended is generally not more than 0.2% by mass and preferably not more than 0.1% by mass relative to 100% by mass of the total composition of the resist overlayer film forming composition of the present invention. These surfactants may be added singly or in combination of two or more.

In the present invention, EUV resists can be used. The EUV resist applied underneath the resist overlayer film in the present invention may be either negative or positive. Examples include: a chemically amplified resist including an acid generator and a binder having a group that is degraded by an acid to change the alkali dissolution rate; a chemically amplified resist including an alkali soluble binder, an acid generator, and a low molecular compound that is degraded by an acid to change the alkali dissolution rate of the resist; a chemically amplified resist including an acid generator, a binder having a group that is degraded by an acid to change the alkali dissolution rate, and a low molecular compound that is degraded by an acid to change the alkali dissolution rate of the resist; a non-chemically amplified resist including a binder having a group that is degraded by EUV to change the alkali dissolution rate; and a non-chemically amplified resist including a binder having a moiety that is cleaved by EUV to change the alkali dissolution rate.

Examples of materials for EUV resists include methacryl-based materials and polyhydroxystyrene (PHS)-based materials. Also in the case where these EUV resists are used, resist patterns can be formed in the same manner as in the case where resists are used with electron beams as a radiation source.

In the present invention, KrF resists or ArF resists can be used. The KrF resists or the ArF resists to be applied to the underlayer of the resist overlayer film of the present invention may be either negative photoresists or positive photoresists. Examples include: a positive photoresist including a novolac resin and 1,2-naphthoquinone diazide sulfonic acid ester; a chemically amplified photoresist including a binder having a group that is degraded by an acid to increase the alkali dissolution rate, and a photo acid generator; a chemically amplified photoresist including a low molecular compound that is degraded by an acid to increase the alkali dissolution rate of the photoresist, an alkali soluble binder, and a photo acid generator; and a chemically amplified photoresist including a binder having a group that is degraded by an acid to increase the alkali dissolution rate, a low molecular compound that is degraded by an acid to increase the alkali dissolution rate of the photoresist, and a photo acid generator. Examples include the trade name APEX-E manufactured by The Dow Chemical Company (the formerly Rohm and Haas Electronic Materials Company), the trade name PAR710 manufactured by Sumitomo Chemical Company, Limited, and the trade name SEPR430 manufactured by Shin-Etsu Chemical Co., Ltd. Other examples include fluorine atom-containing polymer-based photoresists as listed in Proc. SPIE, Vol. 3999, 330-334 (2000), Proc. SPIE, Vol. 3999, 357-364 (2000), and Proc. SPIE, Vol. 3999, 365-374 (2000).

In the present invention, electron beam resists can be used. The electron beam resists to be applied to the underlayer of the resist overlayer film of the present invention may be either negative photoresists or positive photoresists. Examples include: a chemically amplified resist including an acid generator and a binder having a group that is degraded by an acid to change the alkali dissolution rate; a chemically amplified resist including an alkali soluble binder, an acid generator, and a low molecular compound that is degraded by an acid to change the alkali dissolution rate of the resist; a chemically amplified resist including an acid generator, a binder having a group that is degraded by an acid to change the alkali dissolution rate, and a low molecular compound that is degraded by an acid to change the alkali dissolution rate of the resist; a non-chemically amplified resist including a binder having a group that is degraded by electron beams to change the alkali dissolution rate; and a non-chemically amplified resist including a binder having a moiety that is cleaved by electron beams to change the alkali dissolution rate. In the case where these electron beam resists are used, resist patterns can be formed in the same manner as in the case where photoresists are used with KrF, ArF light as a radiation source.

Examples of the developer for a positive resist having a resist overlayer film formed with the resist overlayer film forming composition of the present invention include aqueous solutions of alkalis including: inorganic alkalis such as sodium hydroxide, potassium hydroxide, sodium carbonate, sodium silicate, sodium metasilicate, and aqueous ammonia; primary amines such as ethylamine and N-propylamine; secondary amines such as diethylamine and di-N-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine. The aqueous solutions of alkalis may also contain alcohols such as isopropyl alcohol or a surfactant such as a nonionic surfactant in an appropriate amount to be used. Among these developers, quaternary ammonium salts are preferred, and tetramethylammonium hydroxide and choline are more preferred.

For example, the present invention comprises the steps of: forming an EUV resist film on a substrate having a target film onto which a transfer pattern is to be formed, with or without an EUV resist underlayer film; applying the EUV resist overlayer film forming composition onto the resist film and baking the composition to form an EUV resist overlayer film; exposing the semiconductor substrate coated with the resist overlayer film and the resist film; and performing development after exposure to remove the resist overlayer film and the resist film, so that a semiconductor device can be manufactured. The exposure is performed with EUV (at a wavelength of 13.5 nm).

The resist overlayer film is usually formed by a spin coating method in the same manner as when a resist film is formed. For example, a target film (for example, a silicon/silicon dioxide coating substrate, a glass substrate, and an ITO substrate) is set in a spin coater manufactured by Tokyo Electron Limited to form a resist film on the target film, and then the target film is coated with the resist overlayer film forming composition (varnish) with the number of spin rotations of 700 rpm to 3,000 rpm. After that, the resist overlayer film forming composition is baked on a hot plate at 50° C. to 150° C. for 30 seconds to 300 seconds to form the resist overlayer film. A film thickness of the formed resist overlayer film is 3 nm to 100 nm, or 5 nm to 100 nm, or 5 nm to 50 nm.

A dissolution rate of the formed resist overlayer film to a developing solution for photoresists is 1 nm or more per second, preferably 3 nm or more per second, and more preferably 10 nm or more per second. In the case where the dissolution rate is less than those described above, the time for removal of the resist overlayer film takes longer, which results in lowering of productivity. After forming a pattern with suitable exposure light, the pattern is developed with a resist developing solution to remove unnecessary portions of the resist and resist overlayer film to form a resist pattern.

A semiconductor device to which the EUV resist overlayer film forming composition of the present invention is applied has a target film on which a pattern is to be transferred, a resist film, and a resist overlayer film, which are formed on a substrate in this order. The resist overlayer film can reduce adverse effects caused by the underlying substrate or EUV, thereby forming a good resist pattern in a straight shape and providing a margin for the sufficient EUV radiation dose. The resist overlayer film can have a high wet etching rate equivalent to or more than that of the resist film formed on the underlayer, so that the resist overlayer film and the unnecessary portions of the resist film after exposure can be easily removed with an alkaline developing solution or the like.

The target substrate of a semiconductor device can be processed by either dry etching or wet etching, and a good shape can be transferred to the target film with dry etching or wet etching, by using a resist pattern, which is properly formed with the resist overlayer film, as a mask.

For example, the present invention comprises the steps of: forming a KrF resist film on a substrate having a target film onto which a transfer pattern is to be formed, with or without a KrF resist underlayer film; applying the KrF resist overlayer film forming composition onto the resist film and baking the composition to form a KrF resist overlayer film; exposing the semiconductor substrate coated with the resist overlayer film and the resist film; and performing development after exposure to remove the resist overlayer film and the resist film, so that a semiconductor device can be manufactured. The exposure is performed with KrF. The resist overlayer film is formed in the same manner as in the case of the EUV exposure described above.

For example, the present invention comprises the steps of: forming an ArF resist film on a substrate having a target film onto which a transfer pattern is to be formed, with or without an ArF resist underlayer film; applying the ArF resist overlayer film forming composition onto the resist film and baking the composition to form an ArF resist overlayer film; exposing the semiconductor substrate coated with the resist overlayer film and the resist film; and performing development after exposure to remove the resist overlayer film and the resist film, so that a semiconductor device can be manufactured. The exposure is performed with ArF. The resist overlayer film is formed in the same manner as in the case of the EUV exposure described above.

For example, the present invention comprises the steps of: forming an electron beam resist film on a substrate having a target film onto which a transfer pattern is to be formed, with or without an electron beam resist underlayer film; applying the electron beam resist overlayer film forming composition onto the resist film and baking the composition to form an electron beam resist overlayer film; exposing the semiconductor substrate coated with the resist overlayer film and the resist film; and performing development after exposure to remove the resist overlayer film and the resist film, so that a semiconductor device can be manufactured. The exposure is performed with electron beams. The resist overlayer film is formed in the same manner as in the case of the EUV exposure described above.

EXAMPLES

The weight-average molecular weights (Mw) of the resins (polymers) shown in Synthesis Examples 1 to 37 below in this specification are the measurement results obtained by gel permeation chromatography (GPC). A GPC system manufactured by TOSOH CORPORATION was used in the measurement, and the measurement conditions are as follows. The degree of distribution is calculated from the measured weight average molecular weight and the number average molecular weight.

Measurement device: HLC-8320GPC [product name] (manufactured by TOSOH CORPORATION)

GPC column: TSKgel SuperMultipore HZ-N (P0009) [product name] (manufactured by TOSOH CORPORATION) and TSKgel SuperMultipore HZ-N (P0010) [product name] (manufactured by TOSOH CORPORATION)

Column temperature: 40° C.

Solvent: tetrahydrofuran (THF)

Flow rate: 0.35 ml/min

Standard sample: polystyrene (manufactured by TOSOH CORPORATION)

Synthesis Example 1

To 50.0 g of dioxane, 7.0 g of 1,5-dihydroxynaphthalene (molecular weight: 160.17), 4.6 g of benzaldehyde (molecular weight: 106.12), and 0.87 g of p-toluenesulfonic acid monohydrate were added to be dissolved. The air in the reaction vessel was purged with a nitrogen gas, and the content was reacted at 140° C. for 5 hours to obtain a polymer solution. The obtained solution was added into a solution of methanol:water=7:3 (ratio by weight) to obtain a black polymer. The GPC analysis showed that the weight-average molecular weight of the obtained polymer was 2,344.

Synthesis Example 2

To 17.9 g of dioxane, 6.0 g of phloroglucinol (molecular weight: 126.11), 5.0 g of benzaldehyde (molecular weight: 106.12), and 0.94 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=5:5 (ratio by weight) to obtain a red polymer. The GPC analysis showed that the weight-average molecular weight of the obtained polymer was 1,271.

Synthesis Example 3

To 43.2 g of dioxane, 2.5 g of phloroglucinol (molecular weight: 126.11), 3.3 g of carbazole (molecular weight: 167.21), 4.2 g of benzaldehyde (molecular weight: 106.12), and 0.78 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=5:5 (ratio by weight) to obtain a brown polymer. The GPC analysis showed that the weight-average molecular weight of the obtained polymer was 1,189.

Synthesis Example 4

To 18.4 g of dioxane, 6.5 g of 1,5-dihydroxynaphthalene (molecular weight: 160.17), 4.9 g of 4-hydroxybenzaldehyde (molecular weight: 122.12), and 0.80 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=5:5 (ratio by weight) to obtain a black polymer. The GPC analysis showed that the weight-average molecular weight of the obtained polymer was 2,546.

Synthesis Example 5

To 35.2 g of propylene glycol monomethyl ether, 4.0 g of 1,5-dihydroxynaphthalene (molecular weight: 160.17), 4.3 g of 6-hydroxy-2-naphthaldehyde (molecular weight: 172.18), and 0.49 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a reddish brown polymer. The GPC analysis showed that the weight-average molecular weight of the obtained polymer was 3,757.

Synthesis Example 6

To 44.4 g of propylene glycol monomethyl ether, 2.5 g of 1,5-dihydroxynaphthalene (molecular weight: 160.17), 2.6 g of carbazole (molecular weight: 167.21), 5.3 g of 6-hydroxy-2-naphthaldehyde (molecular weight: 172.18), and 0.62 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a red polymer. The GPC analysis showed that the weight-average molecular weight of the obtained polymer was 2,951.

Synthesis Example 7

To 42.9 g of propylene glycol monomethyl ether, 2.0 g of phloroglucinol (molecular weight: 126.11), 2.6 g of carbazole (molecular weight: 167.21), 5.4 g of 6-hydroxy-2-naphthaldehyde (molecular weight: 172.18), and 0.63 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a red polymer. The GPC analysis showed that the weight-average molecular weight of the obtained polymer was 1,069.

Synthesis Example 8

To 34.3 g of propylene glycol monomethyl ether, 2.0 g of 1,5-dihydroxynaphthalene (molecular weight: 160.17), 1.8 g of 1-naphthol (molecular weight: 144.17), 4.3 g of 6-hydroxy-2-naphthaldehyde (molecular weight: 172.18), and 0.49 g of p-toluenesulfonic acid monohydrate were added to be dissolved. The reaction vessel was purged with a nitrogen gas, and then, the content was reacted at 140° C. for 5 hours to obtain a brown polymer solution. The obtained solution was added into a solution of methanol:water=3:7 (ratio by weight) to obtain a polymer. The GPC analysis showed that the weight-average molecular weight of the obtained polymer was 2,650.

Synthesis Example 9

To 33.4 g of propylene glycol monomethyl ether, 2.7 g of 1,5-dihydroxynaphthalene (molecular weight: 160.17), 1.0 g of 1-naphthol (molecular weight: 144.17), 4.1 g of 6-hydroxy-2-naphthaldehyde (molecular weight: 172.18), and 0.48 g of p-toluenesulfonic acid monohydrate were added to be dissolved. The reaction vessel was purged with a nitrogen gas, and then, the content was reacted at 140° C. for 5 hours to obtain a brown polymer solution. The obtained solution was added into a solution of methanol:water=3:7 (ratio by weight) to obtain a polymer. The GPC analysis showed that the weight-average molecular weight of the obtained polymer was 3,168.

Synthesis Example 10

To 33.2 g of propylene glycol monomethyl ether, 3.5 g of phloroglucinol (molecular weight: 126.11), 2.9 g of 6-hydroxy-2-naphthaldehyde (molecular weight: 172.18), 1.7 g of 2-naphthaldehyde (molecular weight: 156.18), and 0.22 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a red polymer. The GPC analysis showed that the weight-average molecular weight of the obtained polymer was 1,136.

Synthesis Example 11

To 29.1 g of propylene glycol monomethyl ether, 3.5 g of 1,5-dihydroxynaphthalene (molecular weight: 160.17), 2.2 g of 6-hydroxy-2-naphthaldehyde (molecular weight: 172.18), 1.3 g of 2-naphthaldehyde (molecular weight: 156.18), and 0.17 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,482.

Synthesis Example 12

To 33.8 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.6 g of 4-fluorobenzaldehyde (molecular weight: 124.11), and 0.39 g of p-toluenesulfonic acid monohydrate were added to be dissolved. The reaction vessel was purged with a nitrogen gas, and then, the content was reacted at 140° C. for 5 hours to obtain a brown polymer solution. The obtained solution was added into a solution of methanol:water=3:7

(ratio by weight) to obtain a polymer. The GPC analysis showed that the weight-average molecular weight of the obtained polymer was 4,526.

Synthesis Example 13

To 32.8 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.65 g of 4-cyanobenzaldehyde (molecular weight: 131.13), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,420.

Synthesis Example 14

To 33.1 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.75 g of 4-nitrobenzaldehyde (molecular weight: 151.12), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,181.

Synthesis Example 15

To 32.6 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.61 g of 4-hydroxybenzaldehyde (molecular weight: 122.12), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 2,546.

Synthesis Example 16

To 33.6 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.87 g of 4-(trifluoromethyl)benzaldehyde (molecular weight: 174.12), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 2,750.

Synthesis Example 17

To 33.6 g of propylene glycol monomethyl ether, 4.0 g of 1,5-dihydroxynaphthalene (molecular weight: 160.17), 3.0 g of 6-hydroxy-2-naphthaldehyde (molecular weight: 172.18), 1.3 g of 4-(trifluoromethyl)benzaldehyde (molecular weight: 174.12), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,265.

Synthesis Example 18

To 33.6 g of propylene glycol monomethyl ether, 4.0 g of 1,5-dihydroxynaphthalene (molecular weight: 160.17), 2.6 g of 6-hydroxy-2-naphthaldehyde (molecular weight: 172.18), 1.7 g of 4-(trifluoromethyl)benzaldehyde (molecular weight: 174.12), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,537.

Synthesis Example 19

To 33.9 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.8 g of 4-tert-butylbenzaldehyde (molecular weight: 162.23), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a reddish brown polymer. The GPC analysis showed that the weight-average molecular weight of the obtained polymer was 3,123.

Synthesis Example 20

To 33.1 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.75 g of terephthalaldehydic acid (molecular weight: 150.13), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,400.

Synthesis Example 21

To 32.8 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.68 g of 4-methoxybenzaldehyde (molecular weight: 136.15), and 0.39 g of p-toluenesulfonic acid monohydrate were added to be dissolved. The reaction vessel was purged with a nitrogen gas, and then, the content was reacted at 140° C. for 5 hours to obtain a brown polymer solution. The obtained solution was added into a solution of methanol:

water=3:7 (ratio by weight) to obtain a polymer. The GPC analysis showed that the weight-average molecular weight of the obtained polymer was 3,860.

Synthesis Example 22

To 33.6 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.87 g of 2-(trifluoromethyl)benzaldehyde (molecular weight: 174.12), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a reddish brown polymer. The GPC analysis showed that the weight-average molecular weight of the obtained polymer was 3,137.

Synthesis Example 23

To 33.3 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.80 g of 3,4,5-trifluorobenzaldehyde (molecular weight: 160.09), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,397.

Synthesis Example 24

To 34.9 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 1.2 g of 3,5-bis(trifluoromethyl)benzaldehyde (molecular weight: 242.12), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 3,009.

Synthesis Example 25

To 33.9 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.92 g of 4-bromobenzaldehyde (molecular weight: 185.02), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 to obtain a reddish brown polymer. The GPC analysis showed that the weight-average molecular weight of the obtained polymer was 3,585.

Synthesis Example 26

To 33.4 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.83 g of 4-iodobenzaldehyde (molecular weight: 232.02), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a reddish brown polymer. The GPC analysis showed that the weight-average molecular weight of the obtained polymer was 3,157.

Synthesis Example 27

To 34.7 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.83 g of 3,5-dimethoxybenzaldehyde (molecular weight: 166.17), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a reddish brown polymer. The GPC analysis showed that the weight-average molecular weight of the obtained polymer was 3,518.

Synthesis Example 28

To 32.9 g of propylene glycol monomethyl ether, 4.0 g of 1,5-dihydroxynaphthalene (molecular weight: 160.17), 3.4 g of 6-hydroxy-2-naphthaldehyde (molecular weight: 172.18), 0.70 g of 4-chlorobenzaldehyde (molecular weight: 140.57), and 0.39 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a reddish brown polymer. The GPC analysis showed that the weight-average molecular weight of the obtained polymer was 3,228.

Synthesis Example 29

To 14.9 g of propylene glycol monomethyl ether, 4.0 g of phloroglucinol (molecular weight: 126.11), 4.3 g of 6-hydroxy-2-naphthaldehyde (molecular weight: 172.18), 0.99 g of 2-naphthaldehyde (molecular weight: 156.18), and 0.63 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a reddish brown polymer. The GPC analysis showed that the weight-average molecular weight of the obtained polymer was 1,231.

Synthesis Example 30

To 23.6 g of propylene glycol monomethyl ether, 4.0 g of phloroglucinol (molecular weight: 126.11), 4.3 g of 6-hydroxy-2-naphthaldehyde (molecular weight: 172.18), 1.1 g of 2-(trifluoromethyl)benzaldehyde (molecular weight: 174.12), and 0.63 g of p-toluenesulfonic acid monohydrate were added to be dissolved. The reaction vessel was purged with a nitrogen gas, and then, the content was reacted at 140° C. for 5 hours to obtain a red polymer solution. The obtained solution was added into a solution of methanol:water=3:7

(ratio by weight) to obtain a polymer. The GPC analysis showed that the weight-average molecular weight of the obtained polymer was 1,391.

Synthesis Example 31

To 24.5 g of propylene glycol monomethyl ether, 4.0 g of phloroglucinol (molecular weight: 126.11), 4.3 g of 6-hydroxy-2-naphthaldehyde (molecular weight: 172.18), 1.5 g of 3,5-bis(trifluoromethyl)benzaldehyde (molecular weight: 242.12), and 0.63 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a red polymer. The GPC analysis showed that the weight-average molecular weight of the obtained polymer was 1,397.

Synthesis Example 32

To 32.9 g of propylene glycol monomethyl ether, 4.0 g of 1,5-dihydroxynaphthalene (molecular weight: 160.17), 3.7 g of terephthalaldehydic acid (molecular weight: 150.13), and 0.49 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 5,474.

Synthesis Example 33

To 33.4 g of propylene glycol monomethyl ether, 4.0 g of 1,5-dihydroxynaphthalene (molecular weight: 160.17), 0.9 g of 6-hydroxy-2-naphthaldehyde (molecular weight: 172.18), 2.9 g of terephthalaldehydic acid (molecular weight: 150.13), and 0.49 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 6,005.

Synthesis Example 34

To 33.8 g of propylene glycol monomethyl ether, 4.0 g of 1,5-dihydroxynaphthalene (molecular weight: 160.17), 1.7 g of 6-hydroxy-2-naphthaldehyde (molecular weight: 172.18), 2.2 g of terephthalaldehydic acid (molecular weight: 150.13), and 0.49 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 5,954.

Synthesis Example 35

To 34.3 g of propylene glycol monomethyl ether, 4.0 g of 1,5-dihydroxynaphthalene (molecular weight: 160.17), 2.5 g of 6-hydroxy-2-naphthaldehyde (molecular weight: 172.18), 1.5 g of terephthalaldehydic acid (molecular weight: 150.13), and 0.49 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 5,789.

Synthesis Example 36

To 22.6 g of propylene glycol monomethyl ether, 5.0 g of 4,4'-dihydroxydiphenylmethane (molecular weight: 200.23), 3.4 g of 6-hydroxy-2-naphthaldehyde (molecular weight: 172.18), 0.78 g of 2-naphthaldehyde (molecular weight: 156.18), and 0.49 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 1,106.

Synthesis Example 37

To 23.6 g of propylene glycol monomethyl ether, 5.0 g of 4,4'-dihydroxydiphenylmethane, 3.4 g of 6-hydroxy-2-naphthaldehyde (molecular weight: 172.18), 1.2 g of 3,5-bis(trifluoromethyl)benzaldehyde (molecular weight: 242.12), and 0.49 g of p-toluenesulfonic acid monohydrate were added to be dissolved. The reaction vessel was purged with a nitrogen gas, and then, the content was reacted at 140° C. for 5 hours to obtain a polymer solution. The obtained solution was added into a solution of methanol:water=3:7 (ratio by weight) to obtain a brown polymer. The GPC analysis showed that the weight-average molecular weight of the obtained polymer was 1,599.

Example 1

To 0.5 g of the polymer obtained in Synthesis Example 1, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 2

To 0.5 g of the polymer obtained in Synthesis Example 2, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 3

To 0.5 g of the polymer obtained in Synthesis Example 3, 27.7 g of 4-methyl-2-pentanol was added, and the resultant mixture was dissolved. The resultant solution was then filtered through a polyethylene microfilter having a pore

Example 4

To 0.5 g of the polymer obtained in Synthesis Example 4, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 5

To 0.5 g of the polymer obtained in Synthesis Example 5, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 6

To 0.5 g of the polymer obtained in Synthesis Example 6, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 7

To 0.5 g of the polymer obtained in Synthesis Example 7, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 8

To 0.5 g of the polymer obtained in Synthesis Example 8, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 9

To 0.5 g of the polymer obtained in Synthesis Example 9, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 10

To 0.5 g of the polymer obtained in Synthesis Example 10, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 11

To 0.5 g of the polymer obtained in Synthesis Example 11, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 12

To 0.5 g of the polymer obtained in Synthesis Example 12, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 13

To 0.5 g of the polymer obtained in Synthesis Example 13, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 14

To 0.5 g of the polymer obtained in Synthesis Example 14, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 15

To 0.5 g of the polymer obtained in Synthesis Example 15, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 16

To 0.5 g of the polymer obtained in Synthesis Example 16, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 17

To 0.5 g of the polymer obtained in Synthesis Example 17, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 18

To 0.5 g of the polymer obtained in Synthesis Example 18, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 19

To 0.5 g of the polymer obtained in Synthesis Example 19, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 20

To 0.5 g of the polymer obtained in Synthesis Example 20, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 21

To 0.5 g of the polymer obtained in Synthesis Example 21, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 22

To 0.5 g of the polymer obtained in Synthesis Example 22, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 23

To 0.5 g of the polymer obtained in Synthesis Example 23, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 24

To 0.5 g of the polymer obtained in Synthesis Example 24, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 25

To 0.5 g of the polymer obtained in Synthesis Example 25, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 26

To 0.5 g of the polymer obtained in Synthesis Example 26, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 27

To 0.5 g of the polymer obtained in Synthesis Example 27, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 28

To 0.5 g of the polymer obtained in Synthesis Example 28, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 29

To 0.5 g of the polymer obtained in Synthesis Example 29, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 30

To 0.5 g of the polymer obtained in Synthesis Example 30, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 31

To 0.5 g of the polymer obtained in Synthesis Example 5, 27.7 g of 1-heptanol was added, and the resultant mixture was dissolved. The resultant solution was then filtered through a polyethylene microfilter having a pore diameter of 0.05 μm to produce a resist overlayer film forming composition for lithography.

Example 32

To 0.5 g of the polymer obtained in Synthesis Example 5, 27.7 g of cyclopentanol was added, and the resultant mixture was dissolved. The resultant solution was then filtered through a polyethylene microfilter having a pore diameter of 0.05 μm to produce a resist overlayer film forming composition for lithography.

Example 33

To 0.5 g of the polymer obtained in Synthesis Example 5, 27.7 g of 2-methyl-1-butanol was added, and the resultant mixture was dissolved. The resultant solution was then filtered through a polyethylene microfilter having a pore diameter of 0.05 μm to produce a resist overlayer film forming composition for lithography.

Example 34

To 0.5 g of the polymer obtained in Synthesis Example 5 and 0.005 g of bis(4-hydroxyphenyl) sulfone, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 35

To 0.5 g of the polymer obtained in Synthesis Example 5 and 0.005 g of 2,6-diisopropylaniline, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 36

To 0.5 g of the polymer obtained in Synthesis Example 31, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 37

To 0.5 g of the polymer obtained in Synthesis Example 32, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 38

To 0.5 g of the polymer obtained in Synthesis Example 37, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 39

To 0.5 g of the polymer obtained in Synthesis Example 33, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 40

To 0.5 g of the polymer obtained in Synthesis Example 34, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 41

To 0.5 g of the polymer obtained in Synthesis Example 35, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Example 42

To 0.5 g of the polymer obtained in Synthesis Example 32 and 0.6 g of ammonia, 27.0 g of pure water was added, and the resultant mixture was dissolved. The resultant solution was then filtered through a polyether sulfone microfilter having a pore diameter of 0.2 μm to produce a resist overlayer film forming composition for lithography.

Example 43

To 0.5 g of the polymer obtained in Synthesis Example 32 and 0.13 g of tetraethylammonium hydroxide, 26.6 g of pure water was added, and the resultant mixture was dissolved. The resultant solution was then filtered through a polyether sulfone microfilter having a pore diameter of 0.2 μm to produce a resist overlayer film forming composition for lithography.

Example 44

To 0.5 g of the polymer obtained in Synthesis Example 32 and 0.55 g of dimethylaminoethanol, 26.6 g of pure water was added, and the resultant mixture was dissolved. The resultant solution was then filtered through a polyether sulfone microfilter having a pore diameter of 0.2 μm to produce a resist overlayer film forming composition for lithography.

Example 45

To 0.5 g of the polymer obtained in Synthesis Example 32 and 0.55 g of 2,2,2-trifluoroethylamine, 26.6 g of pure water was added, and the resultant mixture was dissolved. The resultant solution was then filtered through a polyether sulfone microfilter having a pore diameter of 0.2 μm to produce a resist overlayer film forming composition for lithography.

Example 46

To 0.5 g of the polymer obtained in Synthesis Example 32 and 0.62 g of tetrabutylammonium hydroxide, 26.6 g of pure water was added, and the resultant mixture was dissolved. The resultant solution was then filtered through a polyether sulfone microfilter having a pore diameter of 0.2 μm to produce a resist overlayer film forming composition for lithography.

Example 47

To 0.5 g of the polymer obtained in Synthesis Example 33 and 0.15 g of ammonia, 27.0 g of pure water was added, and the resultant mixture was dissolved. The resultant solution was then filtered through a polyether sulfone microfilter having a pore diameter of 0.2 μm to produce a resist overlayer film forming composition for lithography.

Example 48

To 0.5 g of the polymer obtained in Synthesis Example 34 and 0.3 g of ammonia, 27.0 g of pure water was added, and the resultant mixture was dissolved. The resultant solution was then filtered through a polyether sulfone microfilter having a pore diameter of 0.2 μm to produce a resist overlayer film forming composition for lithography.

Example 49

To 0.5 g of the polymer obtained in Synthesis Example 35 and 0.3 g of ammonia, 27.0 g of pure water was added, and the resultant mixture was dissolved. The resultant solution was then filtered through a polyether sulfone microfilter having a pore diameter of 0.2 μm to produce a resist overlayer film forming composition for lithography.

Example 50

To 0.5 g of the polymer obtained in Synthesis Example 33 and 0.22 g of tetraethylammonium hydroxide, 26.6 g of pure water was added, and the resultant mixture was dissolved. The resultant solution was then filtered through a polyether sulfone microfilter having a pore diameter of 0.2 μm to produce a resist overlayer film forming composition for lithography.

Example 51

To 0.5 g of the polymer obtained in Synthesis Example 34 and 0.27 g of tetraethylammonium hydroxide, 26.6 g of pure water was added, and the resultant mixture was dissolved. The resultant solution was then filtered through a polyether sulfone microfilter having a pore diameter of 0.2 μm to produce a resist overlayer film forming composition for lithography.

Example 52

To 0.5 g of the polymer obtained in Synthesis Example 35 and 0.37 g of tetraethylammonium hydroxide, 26.6 g of pure water was added, and the resultant mixture was dissolved. The resultant solution was then filtered through a polyether sulfone microfilter having a pore diameter of 0.2 μm to produce a resist overlayer film forming composition for lithography.

Example 53

To 0.5 g of the polymer obtained in Synthesis Example 36, 27.7 g of 4-methyl-2-pentanol was added, and the resultant mixture was dissolved. The resultant solution was then filtered through a polyethylene microfilter having a pore diameter of 0.05 μm to produce a resist overlayer film forming composition for lithography.

Comparative Example 1

1 g of polyhydroxystyrene resin (commercially available product, the weight-average molecular weight is 8,000) was dissolved in 99 g of 4-methyl-2-pentanol to obtain an EUV resist overlayer film forming composition.

Comparative Example 2

1 g of a naphthol novolac resin (a novolac resin was synthesized by allowing 1-naphthol and phenol to react with formaldehyde with a mole ratio of 1-naphthol:phenol=50:50, the weight-average molecular weight was 3,200) was dissolved in 99 g of 4-methyl-2-pentanol to obtain an EUV resist overlayer film forming composition.

(Test of Intermixing with Resist)

An EUV resist solution (methacryl-based resist) was applied by using a spinner. A resist film was formed by heating the resist solution on a hot plate at 100° C. for one minute, and the film thickness was measured (Film thickness A: resist film thickness).

Each of the resist overlayer film forming composition solutions prepared in Examples 1 to 53 and Comparative Examples 1 and 2 of the present invention was applied on the resist film by using a spinner. A resist overlayer film was formed by heating the resist overlayer film forming composition solutions on a hot plate at 100° C. for one minute, and the film thickness was measured (Film thickness B: a sum of the film thicknesses of a resist and a resist overlayer film).

A puddle of liquid was formed on the resist overlayer film with the commercially available developing solution (manufactured by TOKYO OHKA KOGYO CO., LTD., product name: NMD-3), and left for 60 seconds, and then rinsed with purified water for 30 seconds while the resist overlayer film was rotated at 3,000 rpm. After rinsing, the resist overlayer film was baked at 100° C. for 60 seconds, and the film thickness was measured (Film thickness C).

When Film thicknesses A and Film thickness C are equal, the resist overlayer film does not intermix with the resist.

TABLE 1

Measurement of Film Thickness

| | Film Thickness A (nm) | Film Thickness B (nm) | Film Thickness C (nm) |
|---|---|---|---|
| Example 1 | 56 | 76 | 56 |
| Example 2 | 56 | 76 | 56 |
| Example 3 | 56 | 76 | 56 |
| Example 4 | 56 | 76 | 56 |
| Example 5 | 56 | 76 | 56 |
| Example 6 | 56 | 76 | 56 |
| Example 7 | 56 | 76 | 56 |
| Example 8 | 56 | 76 | 56 |
| Example 9 | 56 | 76 | 56 |
| Example 10 | 56 | 76 | 56 |
| Example 11 | 56 | 76 | 56 |
| Example 12 | 56 | 76 | 56 |
| Example 13 | 56 | 76 | 56 |
| Example 14 | 56 | 76 | 56 |
| Example 15 | 56 | 76 | 56 |
| Example 16 | 56 | 76 | 56 |
| Example 17 | 56 | 76 | 56 |
| Example 18 | 56 | 76 | 56 |
| Example 19 | 56 | 76 | 56 |
| Example 20 | 56 | 76 | 56 |
| Example 21 | 56 | 76 | 56 |
| Example 22 | 56 | 76 | 56 |
| Example 23 | 56 | 76 | 56 |
| Example 24 | 56 | 76 | 56 |
| Example 25 | 56 | 76 | 56 |
| Example 26 | 56 | 76 | 56 |
| Example 27 | 56 | 76 | 56 |
| Example 28 | 56 | 76 | 56 |
| Example 29 | 56 | 76 | 56 |
| Example 30 | 56 | 76 | 56 |
| Example 31 | 56 | 76 | 56 |
| Example 32 | 56 | 76 | 56 |
| Example 33 | 56 | 76 | 56 |
| Example 34 | 56 | 76 | 56 |

TABLE 1-continued

Measurement of Film Thickness

| | Film Thickness A (nm) | Film Thickness B (nm) | Film Thickness C (nm) |
|---|---|---|---|
| Example 35 | 56 | 76 | 56 |
| Example 36 | 56 | 76 | 56 |
| Example 37 | 56 | 76 | 56 |
| Example 38 | 56 | 76 | 56 |
| Example 39 | 56 | 76 | 56 |
| Example 40 | 56 | 76 | 56 |
| Example 41 | 56 | 76 | 56 |
| Example 42 | 56 | 76 | 56 |
| Example 43 | 56 | 76 | 56 |
| Example 44 | 56 | 76 | 56 |
| Example 45 | 56 | 76 | 56 |
| Example 46 | 56 | 76 | 56 |
| Example 47 | 56 | 76 | 56 |
| Example 48 | 56 | 76 | 56 |
| Example 49 | 56 | 76 | 56 |
| Example 50 | 56 | 76 | 56 |
| Example 51 | 56 | 76 | 56 |
| Example 52 | 56 | 76 | 56 |
| Example 53 | 56 | 76 | 56 |
| Comparative Example 1 | 56 | 76 | 56 |
| Comparative Example 2 | 56 | 76 | 56 |

[Optical Parameter Test]

Each of the resist overlayer film forming composition solutions prepared in Examples 1 to 53 and Comparative Examples 1 and 2 of the present invention was applied on a quartz substrate by using a spinner. A resist overlayer film (having a film thickness of 30 nm) was formed by heating the resist overlayer film forming composition solutions on a hot plate at 100° C. for one minute. The absorptivity at wavelengths of 190 nm to 260 nm was measured for each of these resist overlayer films by using a spectrophotometer.

The transmittance at 13.5 nm was calculated from a simulation utilizing a relation between an elemental composition ratio and a film density.

For blocking of DUV light, within the range of a wavelength of 220 nm to 260 nm, "Good" refers to the state in which the maximum value of absorptivity was 40% or more, and "Poor" refers to the state in which the maximum value of absorptivity was less than 40%. For permeability of EUV light (13.5 nm), "Good" refers to the state in which the transmittance was 80% or more, and "Poor" refers to the state in which the transmittance was less than 80%.

As a result, a resist overlayer film obtained from each of the resist overlayer film forming compositions of Examples had an excellent blocking effect of DUV light compared to the resist overlayer film obtained from the resist overlayer film forming composition of Comparative Example 1.

TABLE 2

Permeability of EUV and Blocking of DUV

| | Film Thickness (nm) | Permeability of EUV light | Blocking of DUV light |
|---|---|---|---|
| Example 1 | 30 | Good | Good |
| Example 2 | 30 | Good | Good |
| Example 3 | 30 | Good | Good |
| Example 4 | 30 | Good | Good |
| Example 5 | 30 | Good | Good |
| Example 6 | 30 | Good | Good |
| Example 7 | 30 | Good | Good |
| Example 8 | 30 | Good | Good |
| Example 9 | 30 | Good | Good |
| Example 10 | 30 | Good | Good |
| Example 11 | 30 | Good | Good |
| Example 12 | 30 | Good | Good |
| Example 13 | 30 | Good | Good |
| Example 14 | 30 | Good | Good |
| Example 15 | 30 | Good | Good |
| Example 16 | 30 | Good | Good |
| Example 17 | 30 | Good | Good |
| Example 18 | 30 | Good | Good |
| Example 19 | 30 | Good | Good |
| Example 20 | 30 | Good | Good |
| Example 21 | 30 | Good | Good |
| Example 22 | 30 | Good | Good |
| Example 23 | 30 | Good | Good |
| Example 24 | 30 | Good | Good |
| Example 25 | 30 | Good | Good |
| Example 26 | 30 | Good | Good |
| Example 27 | 30 | Good | Good |
| Example 28 | 30 | Good | Good |
| Example 29 | 30 | Good | Good |
| Example 30 | 30 | Good | Good |
| Example 31 | 30 | Good | Good |
| Example 32 | 30 | Good | Good |
| Example 33 | 30 | Good | Good |
| Example 34 | 30 | Good | Good |
| Example 35 | 30 | Good | Good |
| Example 36 | 30 | Good | Good |
| Example 37 | 30 | Good | Good |
| Example 38 | 30 | Good | Good |
| Example 39 | 30 | Good | Good |
| Example 40 | 30 | Good | Good |
| Example 41 | 30 | Good | Good |
| Example 42 | 30 | Good | Good |
| Example 43 | 30 | Good | Good |
| Example 44 | 30 | Good | Good |
| Example 45 | 30 | Good | Good |
| Example 46 | 30 | Good | Good |
| Example 47 | 30 | Good | Good |
| Example 48 | 30 | Good | Good |
| Example 49 | 30 | Good | Good |
| Example 50 | 30 | Good | Good |
| Example 51 | 30 | Good | Good |
| Example 52 | 30 | Good | Good |
| Example 53 | 30 | Good | Good |
| Comparative Example 1 | 30 | Good | Poor |
| Comparative Example 2 | 30 | Good | Good |

[Resist Pattern Formation by EUV Exposure]

A silicon wafer was coated with an organic underlayer film (D layer)-forming composition and was baked on a hot plate at 205° C. for 60 seconds to obtain an organic underlayer film (D layer) having a film thickness of 5 nm. The organic underlayer film (D layer) was spin-coated with a resist solution for EUV (methacrylate resin-based resist), and was heated to form an EUV resist layer (E layer). The resist layer was spin-coated with each of the resist overlayer film forming composition solutions prepared in Example 18, Example 27, Example 42, Example 47, and Comparative Example 2 of the present invention, and was heated at 90° C. for 1 minute to form a resist overlayer film (F layer) (30 nm). After that, the resist overlayer film (F layer) was exposed to light by using an EUV exposure device (Micro Exposure Tool, abbreviated as MET) under conditions of NA=0.30, σ=0.36/0.68 Quadropole. After exposure, PEB was conducted, and then the resist overlayer film was cooled to a room temperature on a cooling plate. Development followed by a rinse treatment was conducted to form a resist pattern. The resist pattern was evaluated with a value of focal depth (nm) at which a line and space pattern of 26 nm was formed. It was confirmed that increased focal depths and wider lithography margins were obtained in all Examples compared to Comparative Example.

TABLE 3

|  | Focal Depth (nm) |
|---|---|
| Example 18 | 120 |
| Example 27 | 120 |
| Example 42 | 80 |
| Example 47 | 120 |
| Comparative Example 2 | 40 |

INDUSTRIAL APPLICABILITY

The present invention provides a composition for forming an EUV resist overlayer film used in an EUV lithography process that selectively transmits EUV by blocking exposure light undesirable for EUV exposure, such as UV and DUV, without intermixing with a resist, and that can be developed with a developing solution after exposure, or a resist overlayer film used in lithography processes at other exposure wavelengths.

The invention claimed is:

1. A resist overlayer film forming composition comprising:
a polymer containing a unit structure of (Formula 1-1):

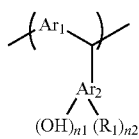

(Formula 1-1)

(in (Formula 1-1), $Ar_1$ is a divalent organic group that contains 1 to 3 benzene ring(s) and optionally contains a hydroxy group; $Ar_2$ is a benzene ring group, a naphthalene ring group, or an anthracene ring group; each of the hydroxy group and $R_1$ is a substituent in place of a hydrogen atom on a ring of $Ar_2$; $R_1$ is a halogen atom, a carboxy group, a nitro group, a cyano group, a $C_{1-6}$ alkoxy group, a $C_{1-6}$ linear or branched saturated alkyl group, or a $C_{1-6}$ linear or branched saturated halogenated alkyl group; each of n1 and n2 is independently an integer of 0 to 9, and a maximum value of (n1+n2) is 9); and
a solvent,
wherein the solvent comprises any of 1-heptanol, 2-methyl-1-butanol, 2-methyl-2-butanol, 4-methyl-2-pentanol, or cyclopentanol.

2. The resist overlayer film forming composition according to claim 1, wherein
$Ar_1$ is an organic group of (Formula 1-2-a), an organic group of (Formula 1-2-c), an organic group of a mixture of (Formula 1-2-a) and (Formula 1-2-b), or an organic group of a mixture of (Formula 1-2-b) and (Formula 1-2-c):

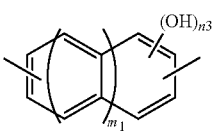

(Formula 1-2-a)

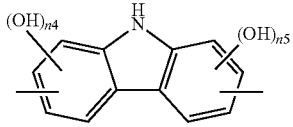

(Formula 1-2-b)

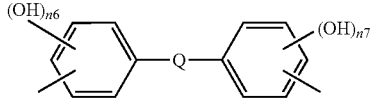

(Formula 1-2-c)

(in Formulae (1-2-a) to (1-2-c), m1 is an integer of 0 to 2; n3 is an integer of 2 to 4; each of n4 and n5 is an integer of 0 to 2; each of n6 and n7 is an integer of 1 or 2; and Q is a single bond or a $C_{1-6}$ alkylene group).

3. The resist overlayer film forming composition according to claim 1, wherein
the polymer containing the unit structure of (Formula 1-1) is synthesized from a compound that contains 1 to 3 benzene ring(s) and optionally contains a hydroxy group and a compound of (Formula 1-3):

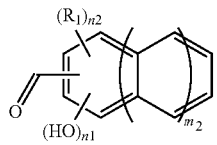

(Formula 1-3)

(in (Formula 1-3), m2 is an integer of 0 to 2; $R_1$ is a halogen atom, a carboxy group, a nitro group, a cyano group, a $C_{1-6}$ alkoxy group, a $C_{1-6}$ linear or branched saturated alkyl group, or a $C_{1-6}$ linear or branched saturated halogenated alkyl group; each of n1 and n2 is independently an integer of 0 to 9, and a maximum value of (n1+n2) is 9).

4. The resist overlayer film forming composition according to claim 1, wherein
a weight-average molecular weight of the polymer measured by a GPC method is 800 to 10,000 in terms of polystyrene.

5. The resist overlayer film forming composition according to claim 1, further comprising a basic compound.

6. The resist overlayer film forming composition according to claim 1, wherein
the solvent additionally comprises water, and
the resist overlayer film forming composition further comprises a basic compound.

7. The resist overlayer film forming composition according to claim 6, wherein
n2 $R_1$(s) contain(s) at least one carboxy group in total.

8. The resist overlayer film forming composition according to claim 1, further comprising an acid compound.

9. The resist overlayer film forming composition according to claim 8, wherein
the acid compound is a sulfonic acid compound or a sulfonic acid ester compound.

10. The resist overlayer film forming composition according to claim 8, wherein
the acid compound is an onium salt acid generator or a halogen-containing compound acid generator.

11. A method for manufacturing a semiconductor device, the method comprising:

forming a resist film on a substrate;
applying the resist overlayer film forming composition as claimed in claim 1 on the resist film and baking the composition to form a resist overlayer film;
exposing the semiconductor substrate coated with the resist overlayer film and the resist film; and
performing development after the exposure to remove the resist overlayer film and the resist film.

12. The method for manufacturing a semiconductor device according to claim 11, wherein
the exposure is performed with EUV at a wavelength of 13.5 nm.

* * * * *